(12) United States Patent
Anderson et al.

(10) Patent No.: US 9,010,042 B2
(45) Date of Patent: Apr. 21, 2015

(54) GROUND MOUNTED SOLAR MODULE INTEGRATION SYSTEM

(71) Applicant: Panelclaw, Inc., North Andover, MA (US)

(72) Inventors: David Anderson, Wellesley, MA (US); Vasilije Jovanovic, Winchester, MA (US); Joseph Armano, North Andover, MA (US)

(73) Assignee: Panelclaw, Inc., North Andover, MA (US)

( * ) Notice: Subject to any disclaimer, the term of this patent is extended or adjusted under 35 U.S.C. 154(b) by 0 days.

(21) Appl. No.: 14/170,375

(22) Filed: Jan. 31, 2014

(65) Prior Publication Data

US 2014/0144853 A1 May 29, 2014

Related U.S. Application Data

(63) Continuation of application No. PCT/US2013/029629, filed on Mar. 7, 2013.

(60) Provisional application No. 61/698,202, filed on Sep. 7, 2012, provisional application No. 61/758,210, filed on Jan. 29, 2013.

(51) Int. Cl.
*E04D 13/18* (2014.01)
*F24J 2/52* (2006.01)
*H01L 31/042* (2014.01)

(52) U.S. Cl.
CPC .............. *H01L 31/0422* (2013.01); *F24J 2/52* (2013.01); *H02S 20/00* (2013.01); *Y02B 10/20* (2013.01); *Y02E 10/47* (2013.01); *Y02E 10/50* (2013.01); *Y10T 29/49826* (2013.01)

(58) Field of Classification Search
USPC ......... 52/173.3, 299; 126/704, 696, 600, 569, 126/700; 248/176.1, 127, 158
See application file for complete search history.

(56) References Cited

U.S. PATENT DOCUMENTS 2,971,736 A 2/1961 Enneper
4,226,256 A 10/1980 Hawley
(Continued)

FOREIGN PATENT DOCUMENTS

DE 1020070 51 714 5/2009
EP 0 344 523 B2 12/1989
(Continued)

OTHER PUBLICATIONS

B. Bienkiewicz and R.N. Meroney: "Wind Effects on Roof Ballast Pavers" Journal of Structural Division, American Society of Civil Engineering. Revised Sep. 1986 and again Jun. 1987 (34 pages).
(Continued)

*Primary Examiner* — Alfred J Wujciak
(74) *Attorney, Agent, or Firm* — Foley & Lardner LLP; Christopher J. McKenna

(57) ABSTRACT

Embodiments of the present inventions are directed to systems, devices for use with systems, and method of mounting and retaining solar panels. In some embodiments, an apparatus for mounting one or more solar panel modules above a supporting surface is disclosed, the apparatus including: three foundational members embedded in the supporting surface; a support frame configured to receive the solar panel modules; a support strut assembly configured to attach the support frame to the three foundational members to support the solar panel modules; where the support strut assembly includes a plurality of strut members, and includes one or more adjustment mechanisms that may be used to adjust a length or a joining angle of at least one of the strut members.

6 Claims, 39 Drawing Sheets

(56) References Cited

U.S. PATENT DOCUMENTS

| | | | |
|---|---|---|---|
| 4,371,139 | A | 2/1983 | Clark |
| 4,372,772 | A | 2/1983 | Wood |
| 4,966,631 | A | 10/1990 | Matlin et al. |
| 5,125,608 | A | 6/1992 | McMaster et al. |
| 5,143,556 | A | 9/1992 | Matlin |
| 5,228,924 | A | 7/1993 | Barker et al. |
| 6,321,851 | B1 | 11/2001 | Weiss et al. |
| 6,774,651 | B1 | 8/2004 | Hembree |
| 8,389,918 | B2 * | 3/2013 | Oosting ............... 250/203.4 |
| 8,550,419 | B2 * | 10/2013 | Hausner et al. ........... 248/370 |
| 2003/0033760 | A1 * | 2/2003 | Rogers et al. ............ 52/167.7 |
| 2003/0140578 | A1 * | 7/2003 | Moreno, Jr. ............. 52/169.1 |
| 2003/0197482 | A1 | 10/2003 | Osuka et al. |
| 2003/0213197 | A1 * | 11/2003 | Oliver et al. ................ 52/299 |
| 2009/0050191 | A1 * | 2/2009 | Young et al. ............... 136/246 |
| 2009/0293861 | A1 | 12/2009 | Taylor et al. |
| 2010/0180884 | A1 * | 7/2010 | Oosting .................... 126/574 |
| 2012/0205514 | A1 | 8/2012 | Hiley et al. |
| 2012/0282064 | A1 | 11/2012 | Payne et al. |
| 2013/0099085 | A1 | 4/2013 | Schwab |
| 2013/0297046 | A1 | 11/2013 | Hendron et al. |
| 2013/0297049 | A1 | 11/2013 | Morita |

FOREIGN PATENT DOCUMENTS

| | | |
|---|---|---|
| WO | WO-94/00650 | 1/1994 |
| WO | WO-2005/040694 | 5/2005 |
| WO | WO-2011/088121 | 7/2011 |

OTHER PUBLICATIONS

Bhaduri, S. and Murphy, L.M.: "Wind Loading on Solar Collectors" prepared for the U.S. Dept. of Energy for contract No. DE-AC02-83CH10093, Golden, CO., Jun. 1985 (50 pages).
Chevalier, H.L. and Norton, D.J.: "Wind Loads on Solar Collector Panels and Support Structure" sponsored by the U.S. Dept. of Energy contract No. EV-76-S-05-5130, Oct. 1979 (98 pages).
Cochran, Leighton S., "Influence of Porosity on the Mean and Peak Wind Loads for Three Concentrator Photovoltaic Arrays" Colorado State University, Fort Collins, CO 1986 (14 pages).
Delmarva Power and Light Co.: 01CDevelopment of a Dispatchable PV Peak Shaving System01D Prepared for the US Dept of Energy Cooperative Agreement No. DE-FC-93CHI0569. Oct. 1995.
Farrington, Robert and Kiss Cathcart Anders Architects, P.C.: Building Integrated Photovoltaics01D from the National Renewable Energy Laboratory for the U.S. Dept. of Energy under Contract No. DE-AC36-83CH10093, Jan. 1993 (64 pages).
Frantzis, Lisa, et al.:CBuilding-Integrated Photovoltaics (BIPV) Analysis and US Market Potential01D, for Building Equipment Div., US Dept of Energy Contract No. DE-AC01-90CE23821 Feb. 1995 (176pages).
Fuentes, Martin: "Simplified Thermal Model for Flat-Plate Photovoltaic Arrays" Prepared by Sandia National Laboratories, Albuquerque, NM, May 1987 (60 pages).

Hersch, Paul; Strawn, Noni; Piekarski, Dick; Cook, Gary: "Photovoltaics for Residential Applications" Technical Information Branch, Solar Energy Research Institute, published Feb. 1984 (23 pages).
International Search Report and Written Opinion for PCT Appl. Ser. No. PCT/US2013/029629 dated Jul. 8, 2013.
Kern, Dr. Edward C. Jr., Ascension Technology: "Low-Cost PV Array Mounting for Flat-roof Buildings" from the Third International Workshop on Photovoltaics in Buildings, Lincoln Center, MA (3 pages).
Kern, Edward C. Jr. and Russell, Miles C.: Array Designs for Flat-Roof Buildings01D retrieved from 1993.
Kern, Edward C., Jr. and Russell, Miles C.: 01CRotating Shadow Band Pyranometer Irradiance Monitoring for Photovoltaic Generation Estimation01D from the 22nd IEEE Photovoltaic Specialists Conference-1991 vol. 1, Las Vegas, NV (7 pages).
Murphy, L.M.: "Wind Loading on Tracking and Field Mounted Solar Collectors", prepared by Solar Energy Research Institute, Golden, CO. for the U.S. Dept. of Energy, Dec. 1980 (10 pages).
Peterka, J.A., Sinou, J.M., and Cermak, J.E.: "Mean Wind Forces on Parabolic-Trough Solar Collectors" prepared for Sandia National Laboratories under Contract No. 13-2412, May 1980 (121 pages).
PV Specifications retrieved from the internet by Greg Pearen, Mar. 23, 2001 (11 pages).
Radu, Adrian; Axinte, Elena; and Theohari, Christina: "Steady Wind Pressures on Solar Collectors on Flat-Roofed Buildings" Journal of Wind Engineering and Industrial Aerodynamics, 23 (1986) 249-258 Elevator Science Publishers B.B., Amsterdam (10 pages).
Russell, M.C.: Solar Photovoltaic Systems for Residences in the Northeast, Lexington, MA, 1980 (7 pages).
Russell, Miles C. and Kern, Edward C. Jr.: "Stand-Off Building Block Systems for Roof-Mounted Photovoltaic Arrays Sandia Contract" 58-8796. Retrieved through Wisconsin Tech Search. Jun. 1986 (212 pages).
Siemens Solar Electric Modules Installation Guide, 1990 (8 pages).
Stafford, Byron: "Design Considerations and Performance of Maspeth a-Si PV System" American Institute of Physics, 1994 (8 pages).
Stiebel Eltron GmbH & Co.: KG: "Mount for the installment of Solar Panels" retrieved from German Patent Office, published Aug. 26, 1982 (9 pages).
Technical Information Branch, Solar Energy Research Institute: "Photovoltaics for Residential Applications" operated for the U.S. Dept. of Energy by Midwest Research Institute, Golden, CO, Feb. 1984 (23 pages).
Tieleman, H.W. et al.: "An Investigation of Wind Loads on Solar Collectors" prepared for the U.S. Dept. of Commerce National Bureau of Standards for contract No. EO-A01-78-3605, Jan. 1980 (173 pages).
Toggweiler, Peter, et. al.: Development of a flat-roof integrated photovoltaic system (SOFREL) Zurich, Switzerland, Mar. 1994 (189 pages).
US Office Action for U.S. Appl. No. 14/169,997 dated Aug. 8, 2014.
US Office Action for U.S. Appl. No. 14/169,997 dated Apr. 9, 2014.

* cited by examiner

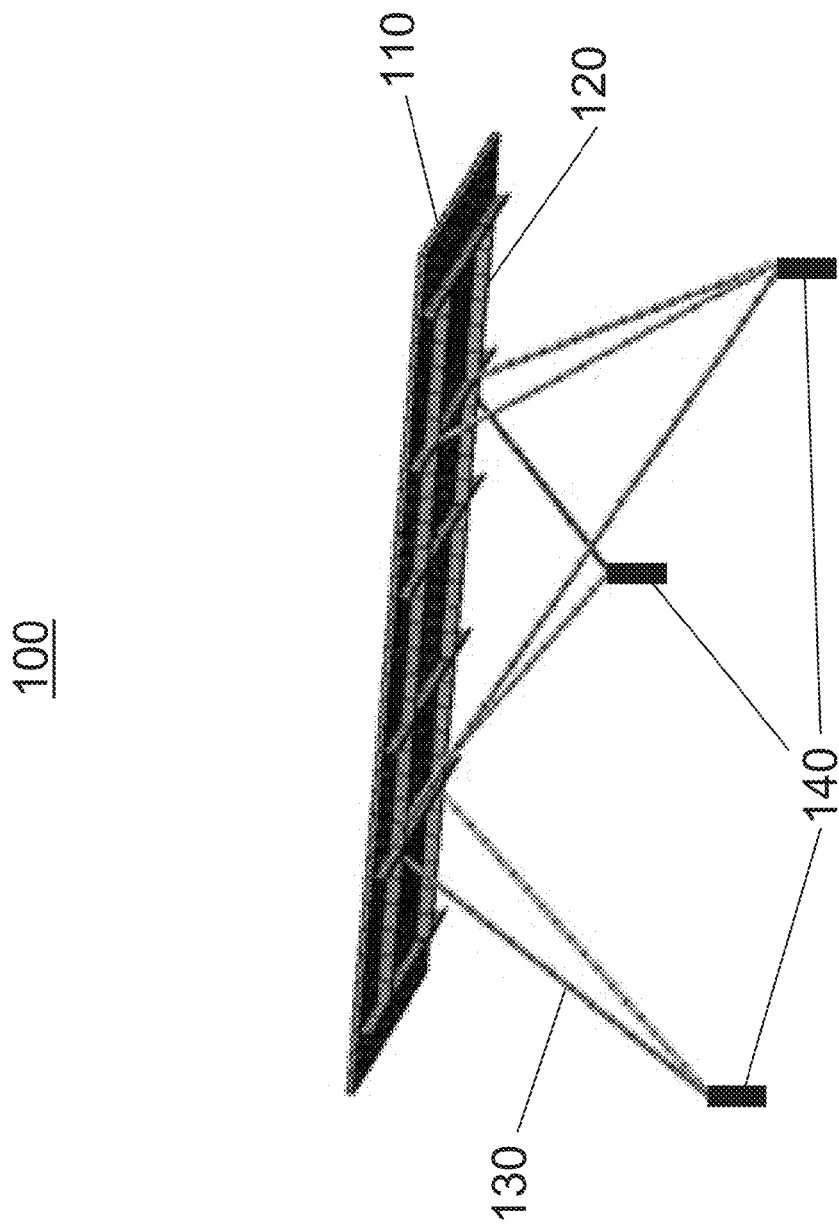

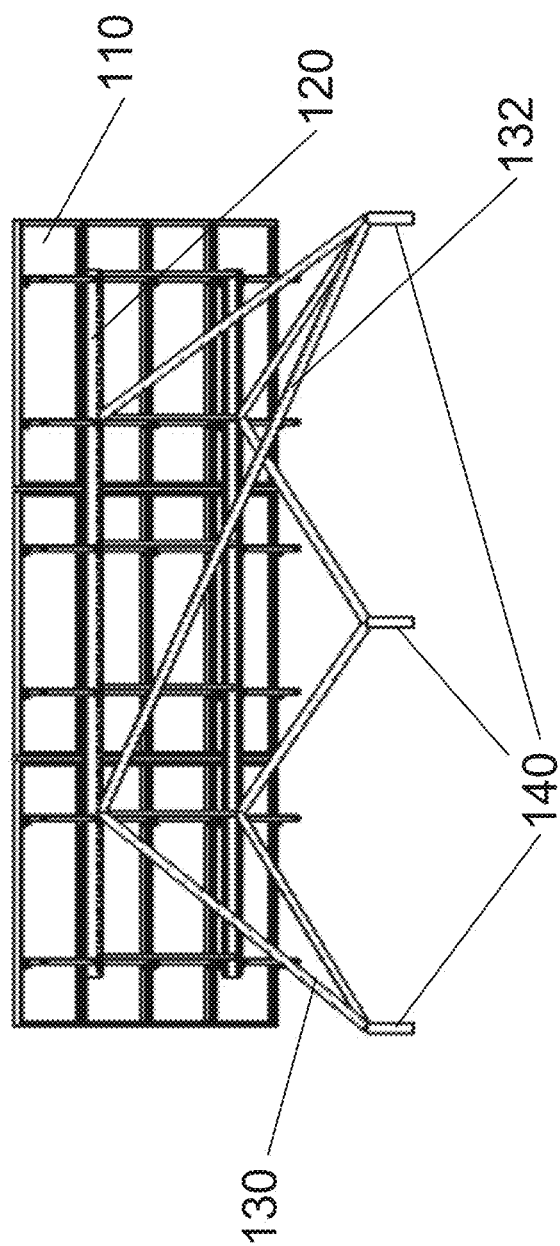

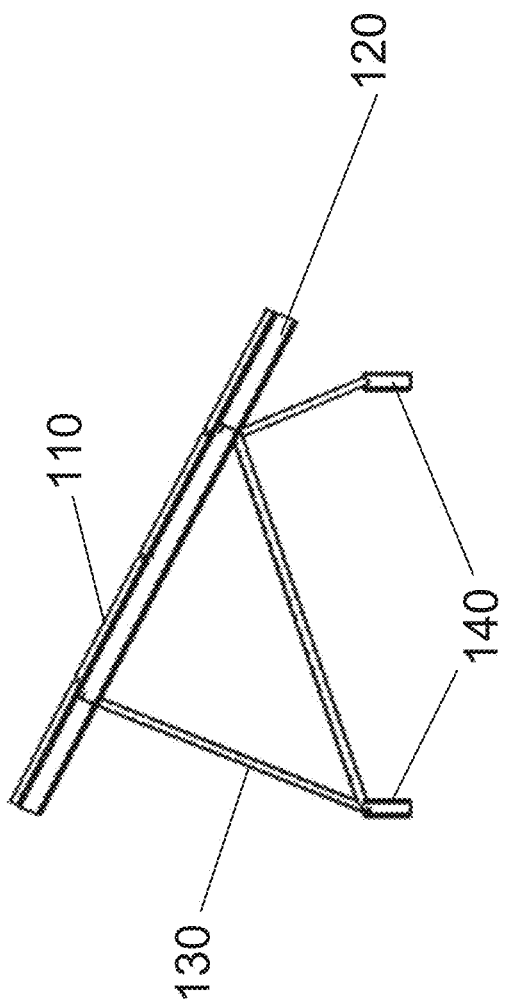

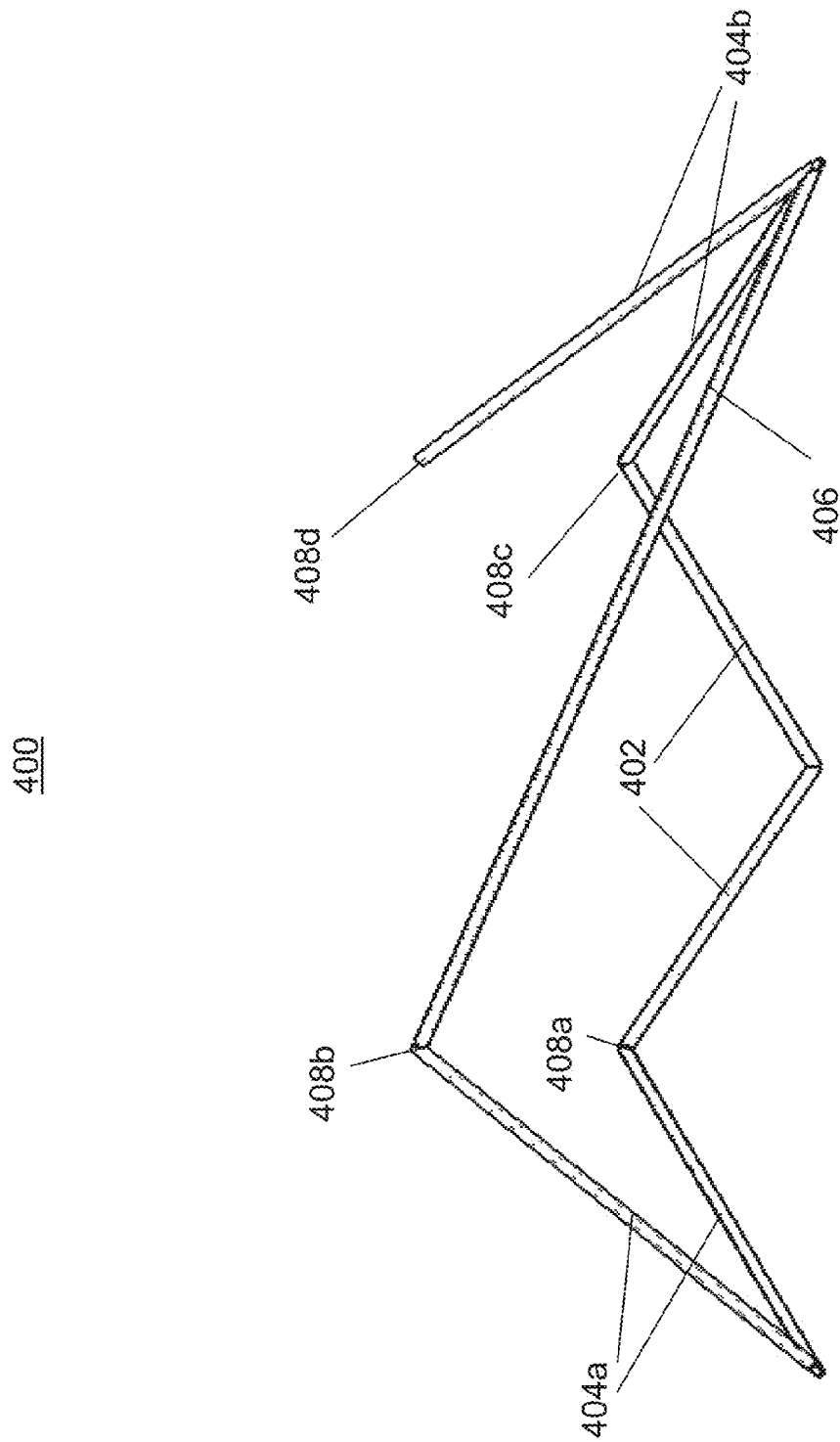

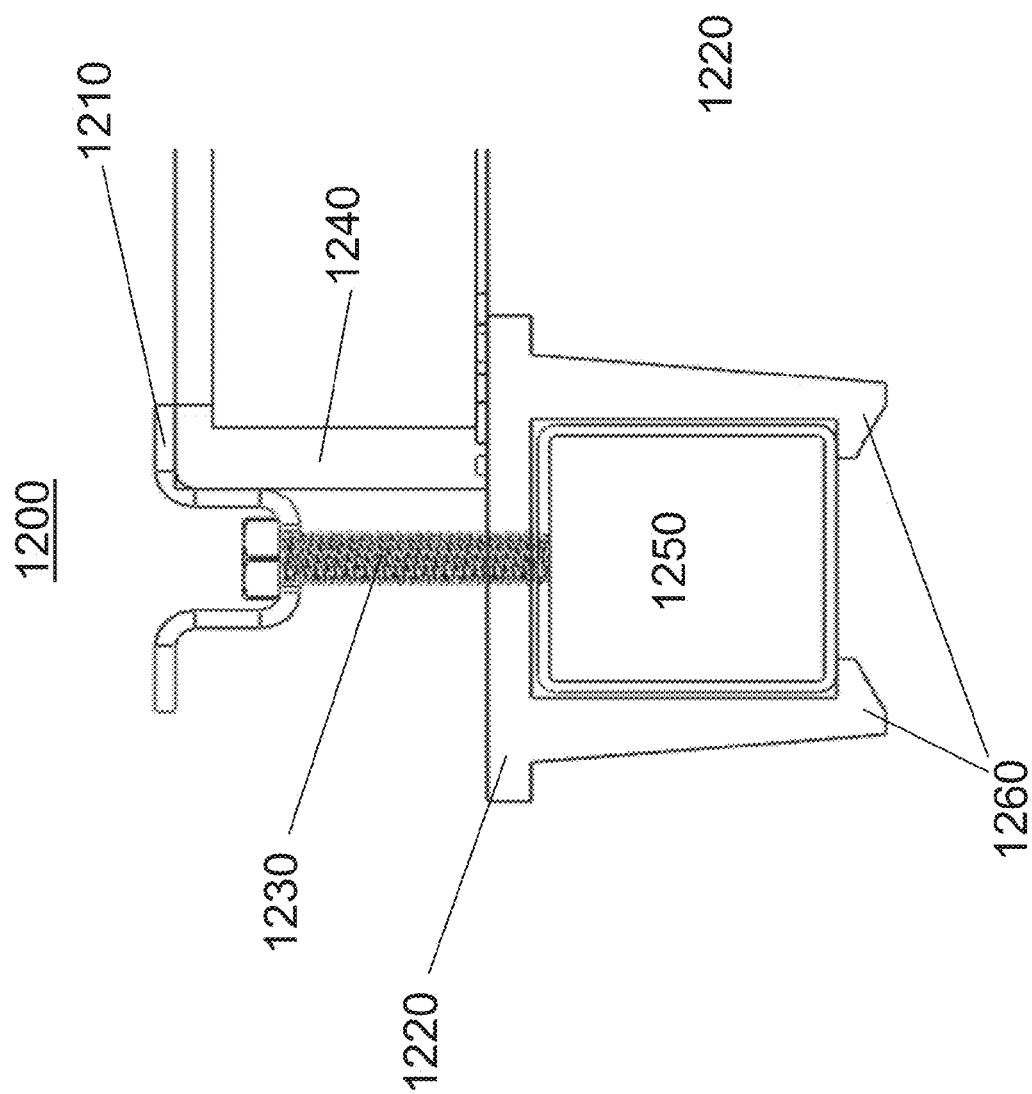

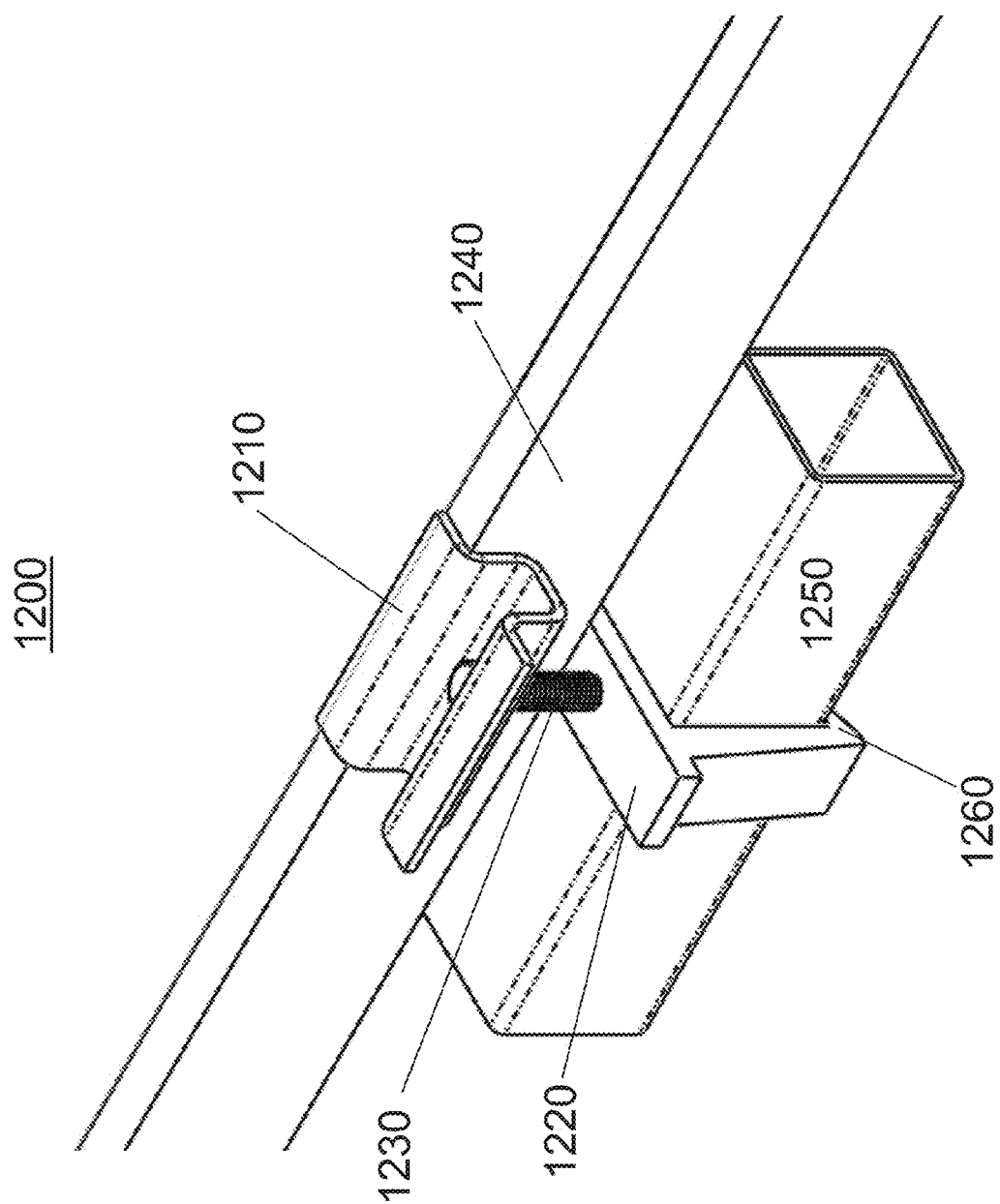

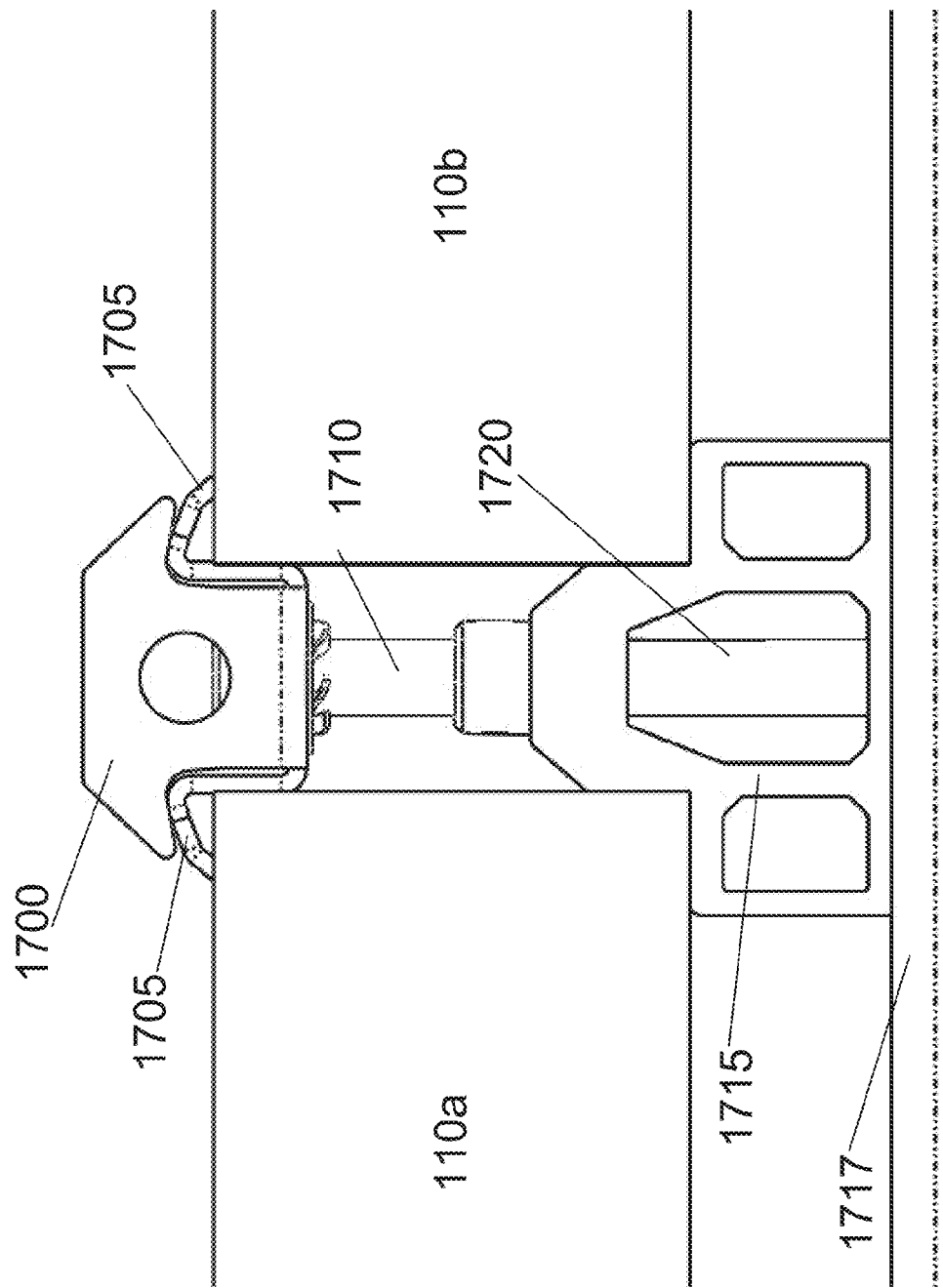

GROUND MOUNTED SOLAR MODULE INTEGRATION SYSTEM

CROSS REFERENCE TO RELATED APPLICATIONS

The present application claims priority to and is a continuation of International Patent Application No. PCT/US2013/029629 entitled "Ground Mounted Solar Module Integration System" filed Mar. 7, 2013, which claims priority to U.S. Provisional Application No. 61/758,210 entitled "Ground Mounted Solar Module Integration System" filed Jan. 29, 2013, and U.S. Provisional Application No. 61/698,202 entitled "Ground Mounted Solar Module Integration Systems" filed Sep. 7, 2012. The contents of each of the foregoing are hereby incorporated herein by reference.

BACKGROUND

Embodiments disclosed herein are directed to systems, devices for use with systems, and methods of mounting and retaining solar panels.

Solar (e.g., photovoltaic) panels are often manufactured in the form of flat rigid structures. To facilitate the performance of the function of generating electricity, solar panels may be mounted in an area exposed to the sun or other source of light. Often, it is desirable to mount solar panels outdoors at an angle from the horizontal so that they will more directly face the sun during peak daylight hours as opposed to panels mounted flat on the ground. In some applications, it may be desirable to mount a number of solar panels together in an array in order to combine the power generation capabilities of the individual panels. In many instances, it may be desirable that mounting systems for solar panel arrays retain the solar panels in place. This may be accomplished by attaching the solar panels to one another in a mounting system and/or by mounting the panels to the mounting system.

For example, U.S. Patent Application Publication No. 2007/0133474 to Mascolo et al. describes a supported solar panel assembly including a solar panel module comprising a solar panel and solar panel module supports including module supports having support surfaces supporting the module, a module registration member engaging the solar panel module to position the solar panel module on the module support, and a mounting element. U.S. Pat. No. 6,534,703 to Dinwoodie describes a solar panel assembly for use on a support surface comprising a base, a solar panel module, a multi-position module support assembly, and a deflector.

SUMMARY

Devices, systems, and techniques are disclosed for mounting and retaining solar panels. In some embodiments, solar panels are mounted in arrays on the ground, e.g. in an open field. In some embodiments, the ground includes local surface undulations, and the array of solar panels may be constructed to compensate for these undulations.

In one aspect an apparatus is disclosed for mounting one or more solar panel modules above a supporting surface, including: three foundational members embedded in the supporting surface; a support frame configured to receive the solar panel modules; and a support strut assembly configured to attach the support frame to the three foundational members to support the solar panel modules. The support strut assembly includes a plurality of strut members, and includes one or more adjustment mechanisms that may be used to adjust a length or a joining angle of at least one of the strut members.

In some embodiments, the plurality of strut members includes at least six strut members, and each of the strut members has a respective adjustment mechanism.

In some embodiments, the support strut assembly is adjustable using six degrees of freedom to allow the support frame to be attached to the three foundational members at a selected position and orientation.

In some embodiments, the support strut assembly is configured such that the plurality of strut members are configured to experience substantially only tension and compression forces.

In some embodiments, the three foundational members are arranged in a triangular configuration having two rear foundational members and one front foundational member, and the support strut assembly includes a front support structure that includes two struts joined at their base on the front foundational member 140 and two side support structures, each of which consists of two struts joined at their base and resting on top of a respective one of the two rear foundational members.

In some embodiments, the support strut assembly includes a cross brace.

In one aspect, a method is disclosed for mounting one or more solar panel modules above a supporting surface. The method includes locating three foundational members embedded in the supporting surface; providing a support frame bearing the solar panel modules; attaching the support frame to the three foundational members using a support strut assembly to support the solar panel modules. The support strut assembly includes a plurality of strut members, and includes one or more adjustment mechanisms that may be used to adjust a length or a joining angle of at least one of the strut members.

In some embodiments, the plurality of strut members includes at least six strut members, and each of the strut members has a respective adjustment mechanism.

In some embodiments, the support strut assembly is adjustable using six degrees of freedom to allow the support frame to be attached to the three foundational members at a selected position and orientation.

In some embodiments, the method further includes attaching the support strut assembly to the foundational members and the support frame such that the plurality of strut members are configured to experience substantially only tension and compression forces.

In some embodiments, the three foundational members are arranged in a triangular configuration having two rear foundational members and one front foundational member, and the support strut assembly includes a front support structure that includes two struts joined at their base on the front foundational member and two side support structures, each of which consists of two struts joined at their base and resting on top of a respective one of the two rear foundational members.

In some embodiments, the method further includes attaching a cross brace to the support strut assembly.

In one aspect, a system is disclosed for mounting one or more solar panel modules above a supporting surface, including: a positioning device for positioning a support frame bearing the solar panels at a rough position relative to one or more foundational members embedded in the surface; acquiring fine position information indicative of the position and orientation of the support frame relative to a reference point; and adjusting the position and orientation of the support frame to a final position based at least in part of the fine position information.

In some embodiments, the positioning device includes a hexapod.

In some embodiments, the hexapod is mounted on a vehicle.

In some embodiments, the system further includes a total positioning system configured to determine the fine position information.

In some embodiments, the system further includes a support strut assembly configured to attach the support frame to the foundational members to support the solar panel modules. The support strut assembly includes a plurality of strut members, and includes one or more adjustment mechanisms may be used to adjust a length or a joining angle of at least one of the strut members.

In some embodiments, the plurality of strut members includes at least six strut members, and wherein each of the strut members has a respective adjustment mechanism.

In some embodiments, the support strut assembly is adjustable using six degrees of freedom to allow the support frame to be attached to three foundational members at a selected position and orientation.

In some embodiments, the support strut assembly is configured to be attached to the foundational members and the support frame such that the plurality of strut members are configured to experience substantially only tension and compression forces.

In one aspect, a method is disclosed for mounting one or more solar panel modules above a supporting surface. The method includes positioning a support frame bearing the solar panels at a rough position relative to one or more foundational members; acquiring fine position information indicative of the position and orientation of the support frame relative to a reference point; and adjusting the position and orientation of the support frame to a final position based at least in part of the fine position information.

In some embodiments, the method further includes using a hexapod to adjust the position and orientation of the support frame.

In some embodiments, the hexapod is mounted on a vehicle, and the vehicle is used to position the support frame at the rough position.

In some embodiments, the method further includes using a total positioning system to determine the fine position information.

In some embodiments, the method further includes using a support strut assembly configured to attach the support frame to foundational members to support the solar panel modules while the positioning device holds the frame in the final position.

In some embodiments, the support strut assembly includes a plurality of strut members, and includes one or more adjustment mechanisms that may be used to adjust a length or a joining angle of at least one of the strut members.

In some embodiments, the plurality of strut members includes at least six strut members, and each of the strut members has a respective adjustment mechanism.

In some embodiments, the support strut assembly is adjustable using six degrees of freedom to allow the support frame to be attached to the three foundational members at a selected position and orientation.

In some embodiments, the method further includes attaching the support strut assembly to the foundational members and the support frame such that the plurality of strut members are configured to experience substantially only tension and compression forces.

Various embodiments may include any of the above described elements, either alone, or in any suitable combination.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1A is a perspective view of a module mount assembly supporting several solar panel modules;

FIG. 1C is a rear view of the module mount assembly of FIG. 1A;

FIG. 1D is a side view of the module mount assembly of FIG. 1A;

FIG. 4C is a rear view of the support strut assembly of FIG. 4A;

FIG. 12A is an over-clamp for securing a module frame to a spar;

FIG. 12B is the over-clamp of FIG. 12A installed to secure a module frame and a spar;

FIG. 17B is a side view of the midclaw of FIG. 17A in its fully installed configuration;

DETAILED DESCRIPTION

Figure 1B:
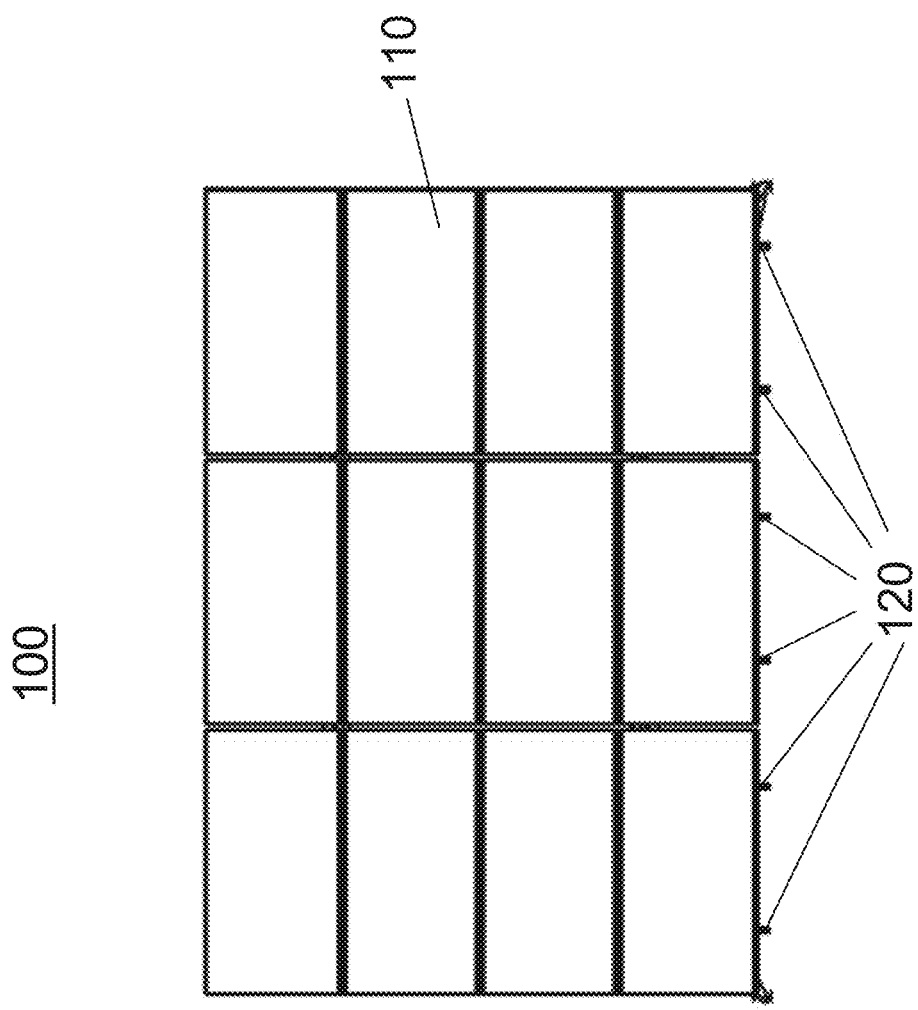
FIG. 1B is a top view of the module mount assembly of FIG. 1A.

The embodiments described herein are not limited to the details of construction and the arrangement of components set forth in the following description or illustrated in the drawings. The embodiments are capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items. The description of one aspect of the embodiments disclosed herein is not intended to be limiting with respect to other aspects of the present embodiments.

FIG. 1A illustrates an example of a section of a module mount assembly 100 for supporting solar panel modules 110 that may be deployed on a mounting surface, for example, an area of open ground such as a field. Aspects of the present implementations may be applied to other mounting surfaces, such as roof structures.

The module mount assembly 100 in this example supports twelve solar panel modules 110 arranged in a rectangular grid, but in various embodiments, any number and arrangement of modules may be used. In some embodiments, the solar panel module 110 is a packaged interconnected assembly of solar cells, e.g., photovoltaic cells. In some embodiments, the solar panel module may be used as a component in a larger photovoltaic system to offer electricity for commercial and residential applications.

The solar panel modules 110 are illustrated in FIG. 1A as being mounted at an angle from the horizontal, but in some embodiments, the solar panel modules may be mounted at angles other than that illustrated in FIG. 1A or even horizontally. The solar panel modules 110 may in some embodiments be mounted at different angles throughout the module mount assembly 100 and uniformly in others such as the one shown in FIG. 1A. The solar panel modules 110 are shown in FIG. 1A facing away from what will be described herein as the Top side of module mount assembly 100. What is described as the Top side may correspond to geographical North position of the module mount assembly 100. As shown here, the Top side may be positioned approximately to the North so that the tilted faces of the panel modules are directed generally toward the South, e.g., tilted to more squarely face the direction of the sun for an installation north of the equator. In some embodiments, deflector elements (not shown) may be mounted facing the lateral sides (i.e., the sides perpendicular to the Top side) at the edges of the module mount assembly 100, or in other positions on the module mount assembly 100 to deflect wind currents. Of course, in various embodiments, any other suitable arrangement may be used.

Solar panel modules 110 in this example are mounted on a module frame 120 which is in turn mounted on a support strut assembly 130. The support strut assembly 130 is mounted on a foundation 140. A support frame is a support structure that may be used to support at least a portion of a solar panel; in this example, the module frame 120 is used to support twelve solar panel modules 110. A support strut assembly is an adjustable support structure which supports the module frame 120 and the solar panel modules 110. A foundation is a structure that contacts the ground and provides support for the support strut assembly 130, the module frame 120, and the solar panel modules 110. Examples of the foundation 140, the support strut assembly 130, and the module frame 120 are described more fully below.

FIG. 1B illustrates a top view of the module mount assembly 100 of solar panel modules 110 depicted in FIG. 1A. As shown in FIG. 1B, the module mount assembly includes 12 solar panel modules 110, arranged in a coplanar configuration. Although the solar panel modules 110 are shown arranged in 3 columns and 4 rows ("3×4"), other configurations are possible. For example, in other implementations, the solar panel modules 110 can be arranged in 4 columns×3 rows, 2 columns×6 rows, or 6 columns×2 rows, etc. Also shown in FIG. 1B are the portions of the module frame 120 that extend slightly beyond the edges of the solar panel modules 110.

FIG. 1C illustrates a rear view of the module mount assembly 100 of solar panel modules 110 depicted in FIG. 1A. The support strut assembly can include a cross brace 132. In other implementations, the support strut assembly does not include the cross brace 132.

FIG. 1D illustrates a side view of the module mount assembly 100 of solar panel modules 110 depicted in FIG. 1A. As depicted in FIG. 1B, the solar panel modules 110 can be configured at an angle relative to the ground. In some implementations, the angle is selected to maximize exposure of the top surfaces of the solar panel modules 110 to the sun or other light source. For example, the angle of the solar panel modules 110 can be selected based on the latitude of the location where the solar panel modules 110 are to be installed.

Figure 2:
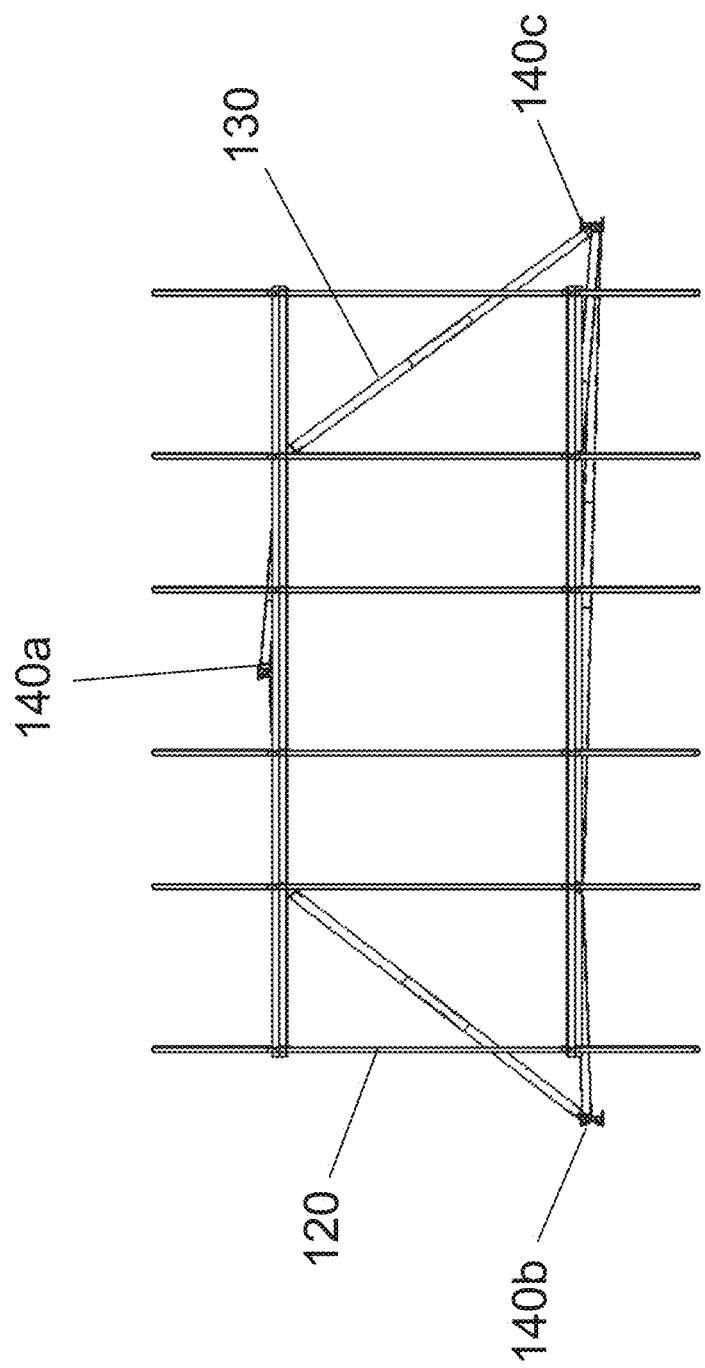
FIG. 2 is a top view of the foundational components of a system for mounting an array of solar panels.

FIG. 2 is a top view of the foundational components of a system for mounting one or more solar panel modules. The view shown in FIG. 2 is similar to that shown in FIG. 1B. The solar panel modules have been removed from the view of FIG. 2 to more clearly display the other components, such as the support frame 120, the support strut assembly 130, and the foundational members 140. As shown, the foundational members 140a-140c are each in contact with the ground. The foundational members 140 are arranged in a triangular configuration. The foundational member 140a is located beneath the front portion of the of the module mount assembly, while the other two foundational members 140b and 140c are located beneath either side and toward the rear of the module mount assembly. In some implementations, the rear two foundational members 140b and 140c are positioned to provide support through the support strut assembly 130 at or near the Airy points of the structure made up of the support frame 120 and the modules 110. Airy points are defined as the two points that are equidistant from the center of a member and separated by a distance of $1/\sqrt{3}$ times the length of the member, or approximately ⅝ the length of the member. In some implementations, the foundational members 140 can be arranged differently (e.g., the module mount assembly can be supported by two front foundational members and one rear foundational member).

The three point configuration of foundational members 140 provides strong support for the module mount assembly 100 and allows for easily expandable installation of module mount assemblies. For example, while each individual module mount assembly 100 can support 12 solar panel modules 110 as discussed above in connection with FIG. 1A, an installation site may be a large parcel of land with sufficient area for many module mount assemblies. If a second module mount assembly is desired at an installation site, the two rear foundational members 140b and 140c can be shared with the second module mount assembly and the second module mount assembly can be installed adjacent to the first module mount assembly. Thus, a first module mount assembly requires three foundational members, but each additional module mount assembly requires only an additional two foundational members. For an arbitrarily large number of module mount assemblies, only two foundational members are required per module mount assembly.

Although a three point foundation configuration is shown, in some embodiments, more or fewer support points may be used (e.g., one, two, four, five, or more support points).

Figure 3C:
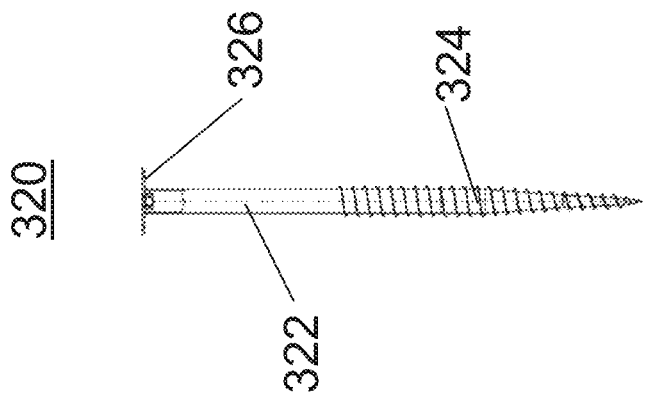
FIG. 3C is an earth screw.
Figure 3B:
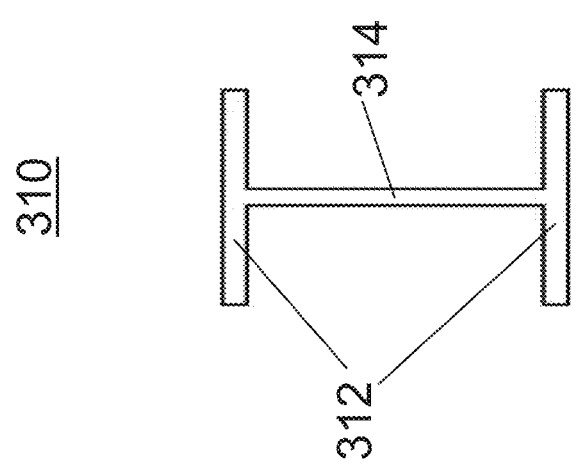
FIG. 3B is an I-beam pile.
Figure 3A:
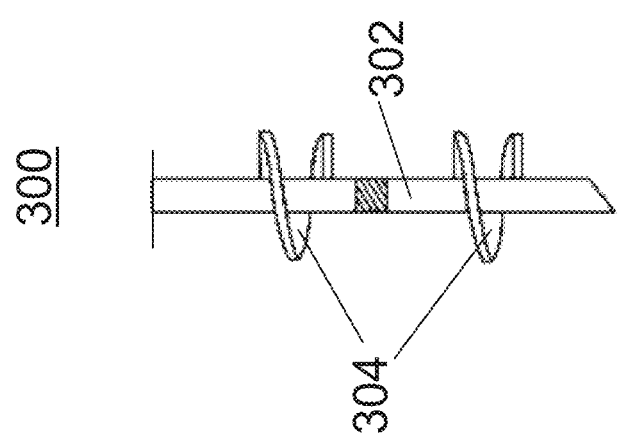
FIG. 3A is a helical pile.

FIG. 3A is a helical pile 300 that can be used as any of the foundational members 140 of FIG. 2. The helical pile 300 can include an elongated shaft 302 and helical platforms 304. In some implementations, the elongated shaft 302 can have a sharp point at its bottom end to facilitate driving the helical pile into the ground. A portion of the helical pile 300 can be driven into the ground providing support for the other components in the system.

FIG. 3B is a cross sectional view of an I-beam pile 310 that can be used as any of the foundational members 140 of FIG. 2. The I-beam pile 310 includes two thin rectangular outer members 312 coupled to a third rectangular inner member 314. The I-beam pile 310 can be driven into the ground, for example using a hydraulic pile driver, and the exposed portion can be used to support the other components of the solar panel module mount assembly.

FIG. 3C is an earth screw 320 that can be used as any of the foundational members 140 of FIG. 2. The earth screw 320 has an elongated shaft 322, a threaded section 324, and a platform 326. The earth screw 320 can be screwed into the ground and the platform 326 can support the other components of the system.

Figure 4A:
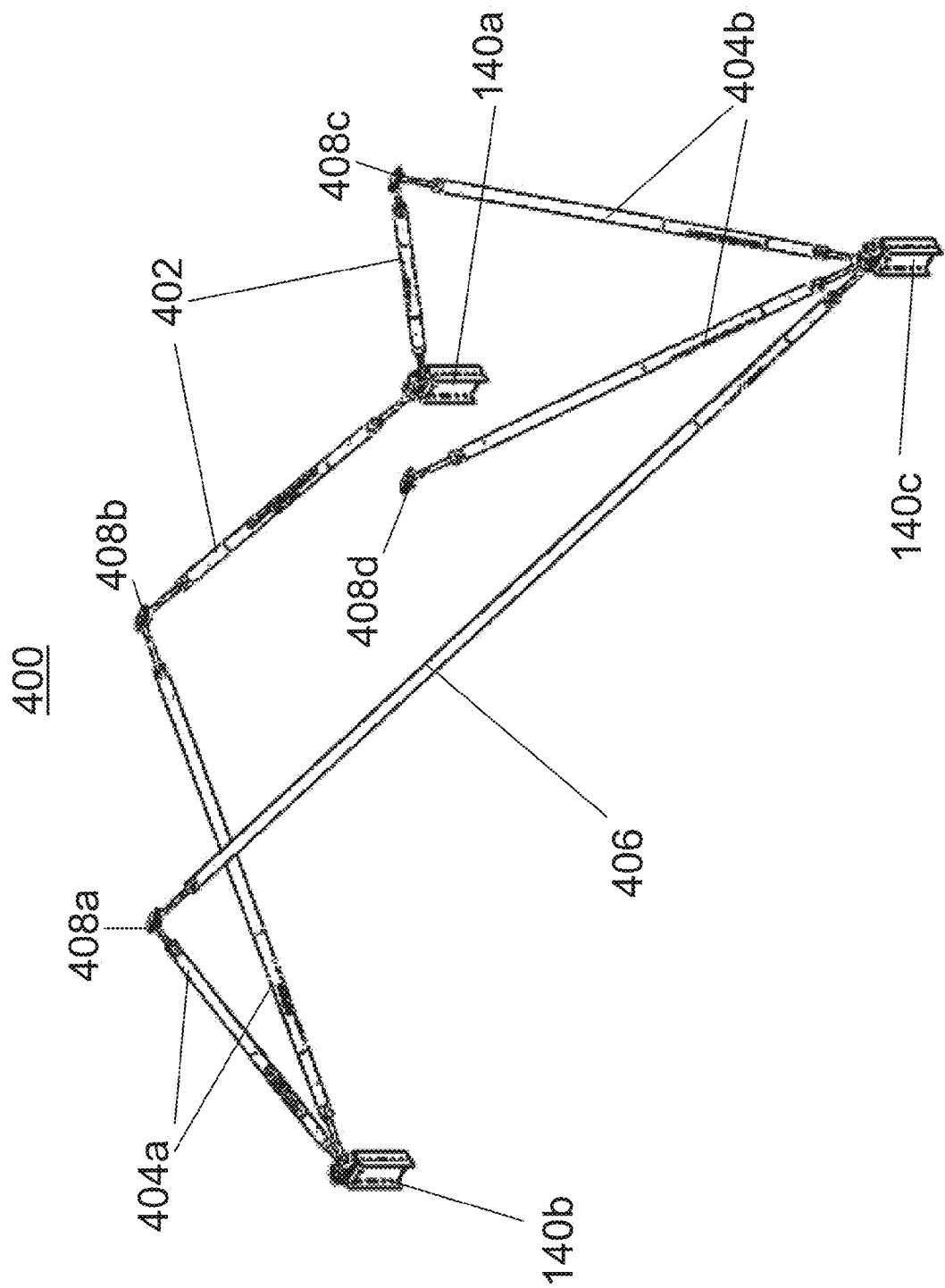
FIG. 4A is a perspective view of a support strut assembly that can be used for mounting an array of solar panels.
Figure 4B:
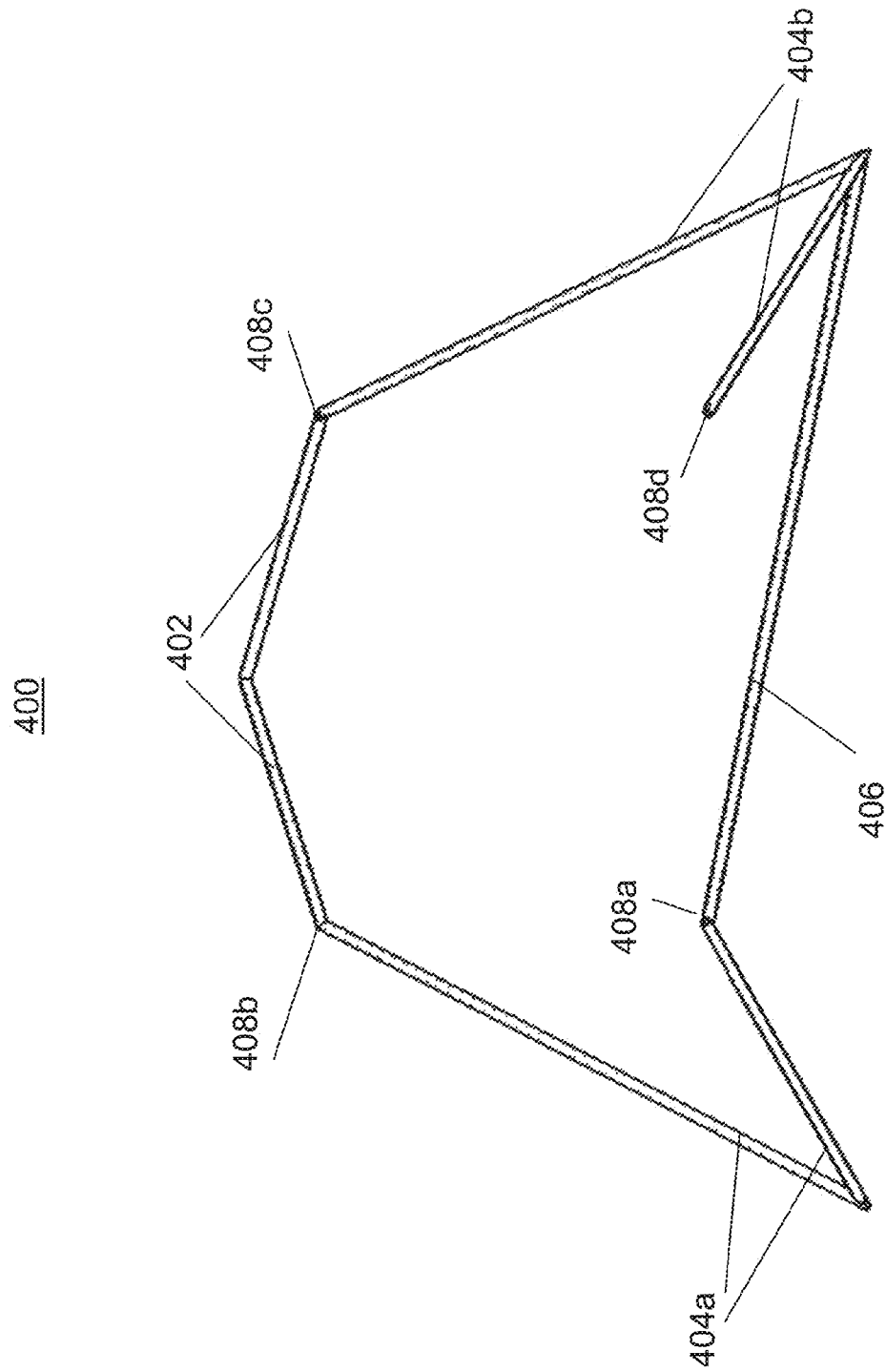
FIG. 4B is a top view of the support strut assembly of FIG. 4A.
Figure 4D:
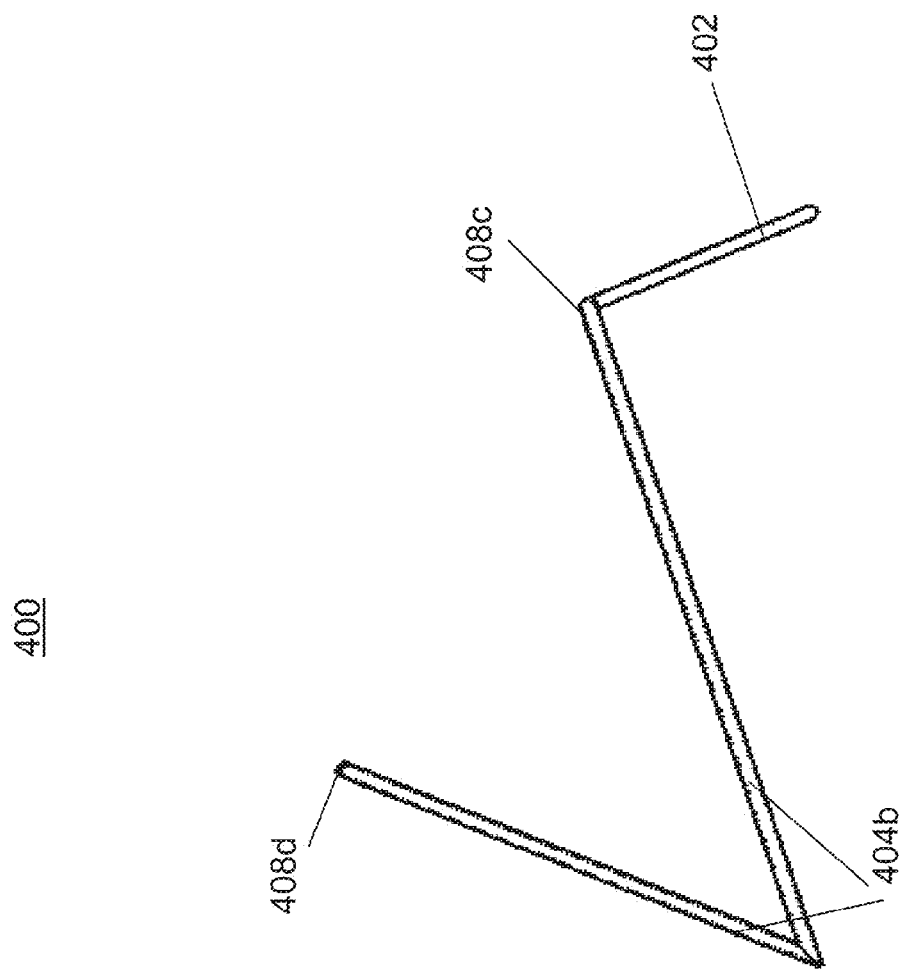
FIG. 4D is a side view of the support strut assembly of FIG. 4A.

FIG. 4A is a support strut assembly 400 that can be used to support an array of solar panel modules. The support strut assembly 400 consists of a series of structural members called struts, which rest atop the foundational members discussed in connection with FIGS. 3A-3C. A front support structure 402 includes two struts joined at their base on the front foundational member 140a. The support strut assembly 400 also includes two side support structures 404a and 404b, each of which consists of two struts joined at their base and resting on top of the two rear foundational members 140b and 140c, respectively. In some implementations, the support strut assembly 400 can include a cross brace 406 extending from the base of side support structure 404b to the top of side support structure 404a. In its final configuration, the front support structure 402 and the side support structures 404a and 404b of support strut assembly 400 are mechanically coupled to support an array of solar panels. The points 408a-408d are coincident with a plane on which an array of solar panel modules or a frame can be secured (e.g., a plane defined by any three points selected from points 408a-408d). FIGS. 4B, 4C, and 4D depict top, rear, and side views of the support strut assembly 400, respectively. For simplicity, the support strut assembly of FIGS. 4B-4D does not include the front foundational member 140a or the rear foundational members 140b and 140c. As discussed above, the angle of the plane defined by points 408a-408d can be selected to maximize exposure of a solar panel array to the sun or another light source. The angles and/or lengths of the struts in support strut assembly 400 are adjustable such that the desired position and orientation for the array of solar panel modules can be easily achieved despite uneven terrain surface at the installation site. The mechanisms for adjustment are described further below.

Figure 5:
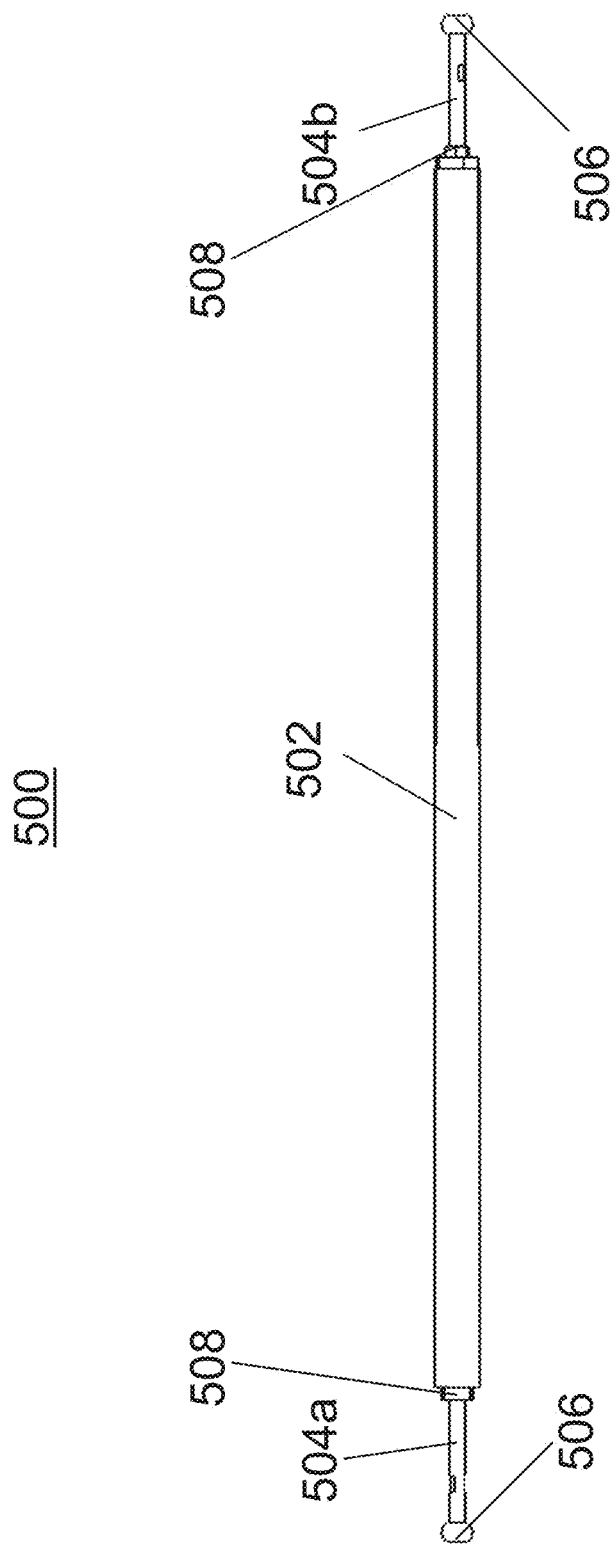
FIG. 5 is a strut used in the support strut assembly of FIGS. 4A-4D.

FIG. 5 depicts a strut 500 that can be used as any of the structural elements of the support strut assembly 400 shown in FIGS. 4A-4D. The strut 500 includes a central support tube 502 and two threaded rods 504a and 504b. The support tube 502 is a hollow member which can include threaded inserts. The threaded inserts couple to the threads on the threaded rods 504a and 504b. Each threaded rod 504a and 504b also includes a ball end 506 for mechanically joining to the other components of the system, such as the foundational components described in connection with FIGS. 3A-3C and the support frame described in connection with FIG. 2. In some implementations, rod 504a has right-hand threads and rod 504b has left-hand threads. The length of the strut 500 can therefore be adjusted by rotating the support tube 502 while the rods 504a and 504b remain in a fixed orientation. For example, rotating support tube 502 in one direction will cause the rods 504a and 504b to be drawn into the support tube 502, thus shortening the overall length of the strut 500. Rotating the support tube 502 in the opposite direction will cause the threaded rods 504a and 504b to extend outward from the support tube 502, which will increase the overall length of the strut 500. In some implementations, the threads on the support tube 502 and the threaded rods 504a and 504b are configured such that a full rotation of the support tube 502 results in an increase or decrease of about 0.2 inches in the overall length of the strut 500. In some implementations, the strut 500 can also include a lock nut 508. After the strut 500 has been adjusted to its desired size, the lock nut 508 can be tightened to prevent the support tube 502 from rotating with respect to the threaded rods 504a and 504b, thus maintaining the desired length of the strut 500.

Figure 6A:
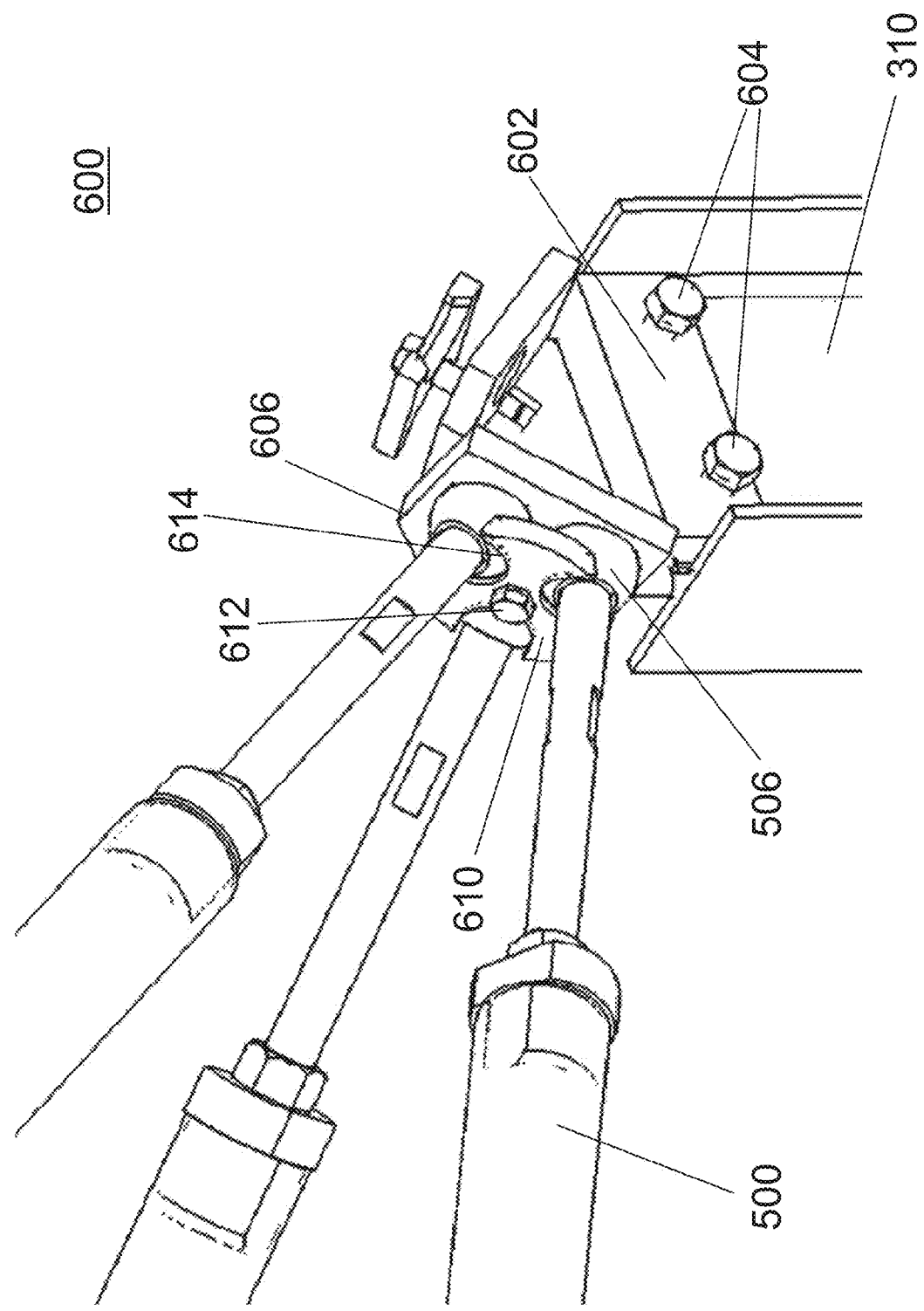
FIG. 6A is a three support strut ball clamp.

FIGS. 6A-6D depict various implementations of kinematic mounts for joining the struts to the other components of the system. For example, FIG. 6A is a three support strut kinematic mount 600 that can be used to join up to three struts to a single pile. In one implementation, the three support strut kinematic mount 600 can be used as the connection point between the rear support structure 140c, the side support structure 404b, and the cross brace 406 of FIG. 4A. An I-beam pile, similar to the I-beam pile 310 of FIG. 3B is shown in FIG. 6A. However, any other type of pile could be used, such as the helical pile 300 of FIG. 3A or the earth screw 320 of FIG. 3C.

The three support strut kinematic mount 600 includes a pile connection 602. The pile connection can be mechanically fastened to the pile, for example using bolts 604. In some implementations, the pile connection 602 provides an electrical path to ground between the support strut assembly and the pile 310. For example, in some embodiments, the pile connection may be a pinch type connection that grasps the pile 310.

The kinematic mount 600 also includes a plate 606 coupled to the pile connection 602. As shown in the figure, the plate 606 can be aligned at an angle relative to the pile connection 602. The plate 606 has three conical seats 608 into which the ball end 506 of a strut 500 can be partially inserted (see conical seat 608 of FIG. 6B). The kinematic mount 600 also includes a clamp 610. The clamp 610 can be fastened to the plate 606 with a bolt 612, such that the ball end 506 is secured between the plate 606 and the clamp 610. In some implementations, the bolt 612 is a captive bolt that is preinstalled on the clamp 610. The clamp also includes chamfered slots 614 which fit around the ball end 506. The shape of the chamfered slot 614 and the conical seat 608 allow the ball end 506 to rotate freely so that the angle of the strut 500 can be modified, while maintaining the connection between the ball end 506 and the pile 310. The freedom of rotation provided by the kinematic mount 600, combined with the adjustable length of the struts 500 described in connection with FIG. 5, allow the support strut assembly 400 to be adaptable to uneven ground at the installation site. Note that, in some embodiments, the use of the conical seat 608 in combination with the chamfered slots 614 allows the kinematic mount to be assembled easily without the need for careful alignment or elements machined to tight tolerances.

Figure 6B:
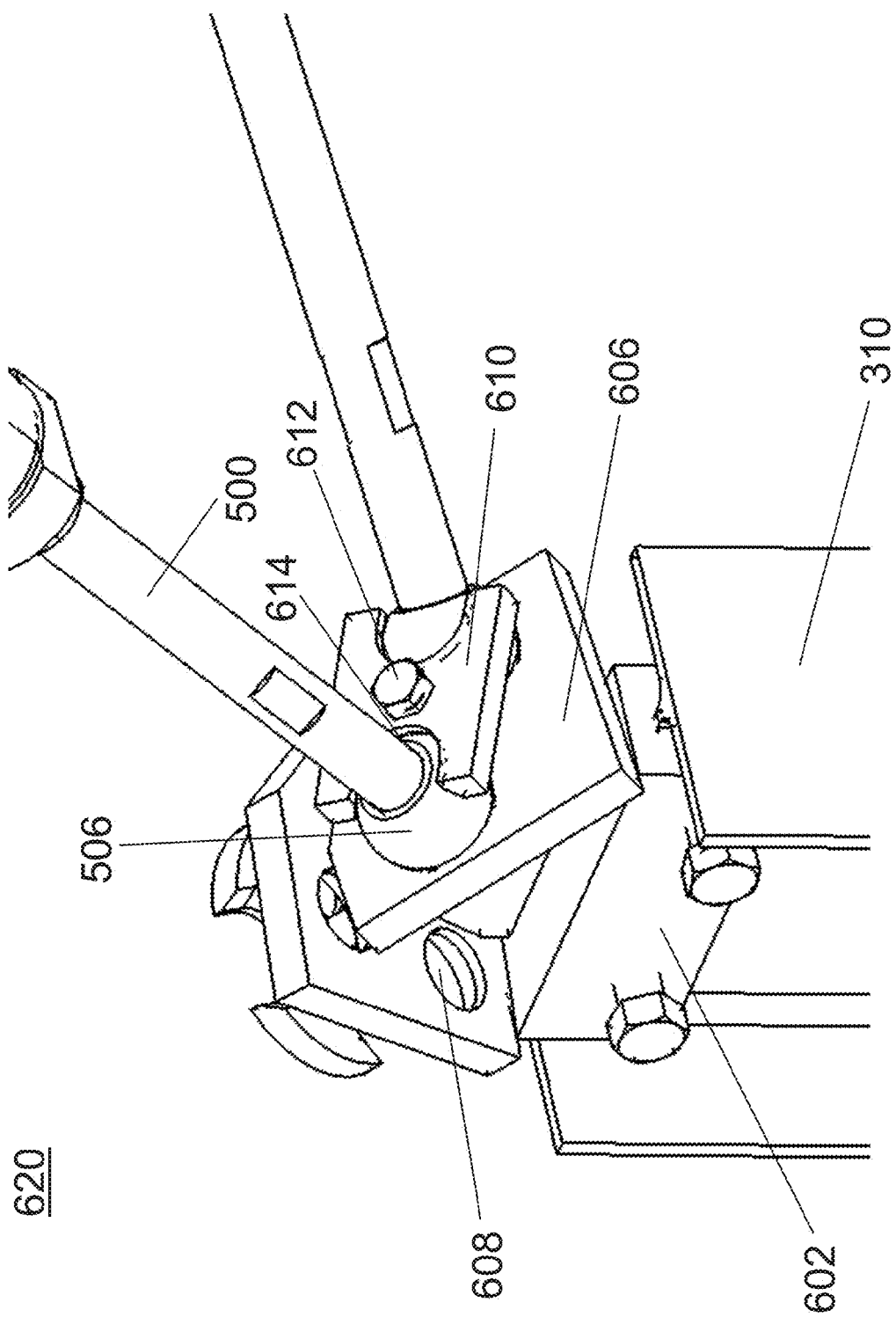
FIG. 6B is a two support strut ball clamp.
Figure 6C:
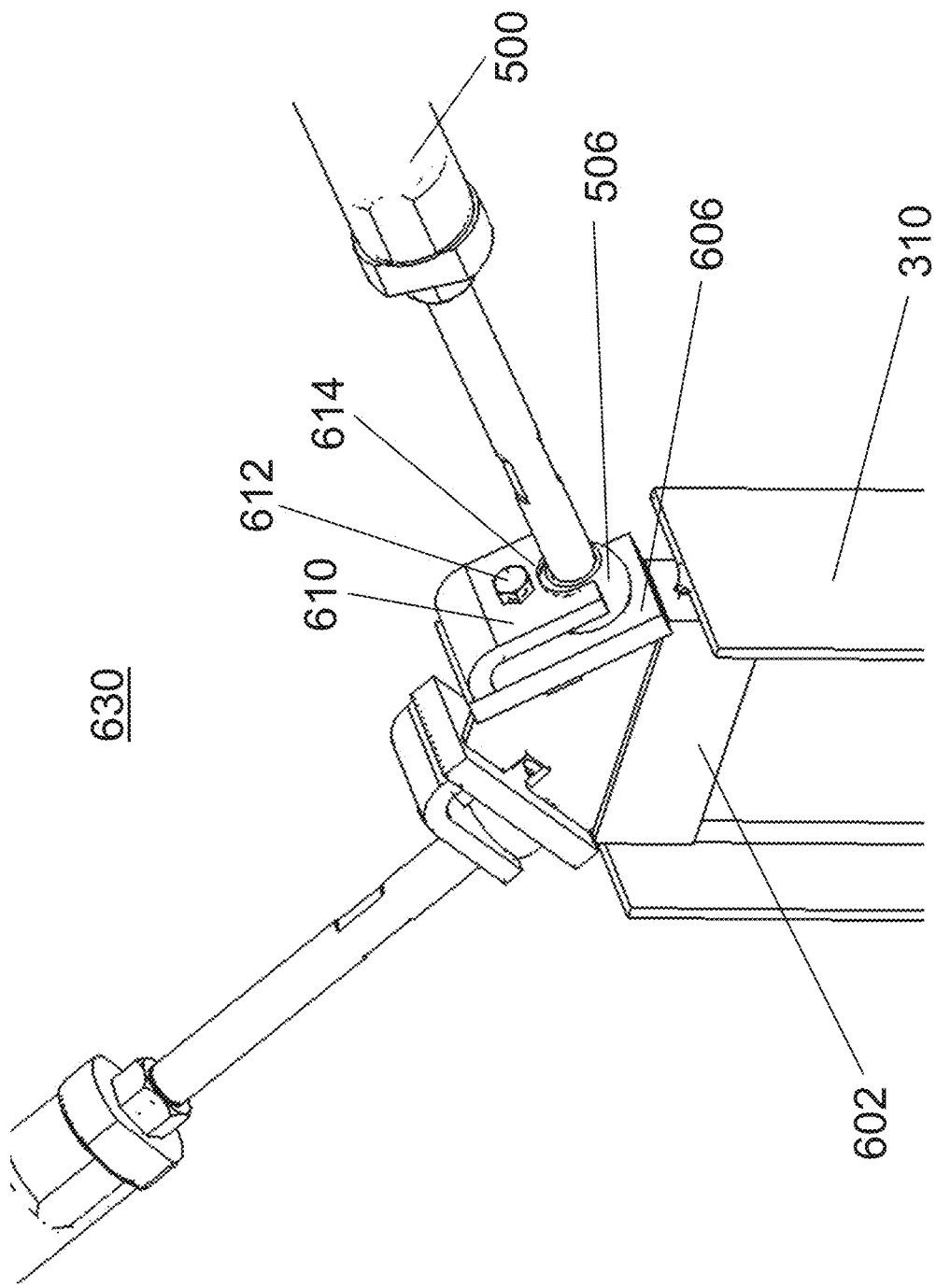
FIG. 6C is a single support strut ball clamp.

FIG. 6B depicts a two support strut kinematic mount 620 and FIG. 6C depicts a single support strut kinematic mount 630. The components of the kinematic mount 620 and 630 are similar to the components described above in connection with the three support strut kinematic mount 600 of FIG. 6A. For example, the kinematic mount 620 and 630 each have a pile connection 602, a plate 606 with conical seats 608, and a clamp 610. The distinguishing features are the number of cutouts 608 and the shape of the clamp 610. In one implementation, the two support strut kinematic mount 620 can be used as the connection point between the rear support structure 140b and the side support structure 404a of FIG. 4A. The single support strut kinematic mount 630 can be used as the connection point between the front structural support member 140a and the side support structure 402 of FIG. 4A.

Figure 6D:
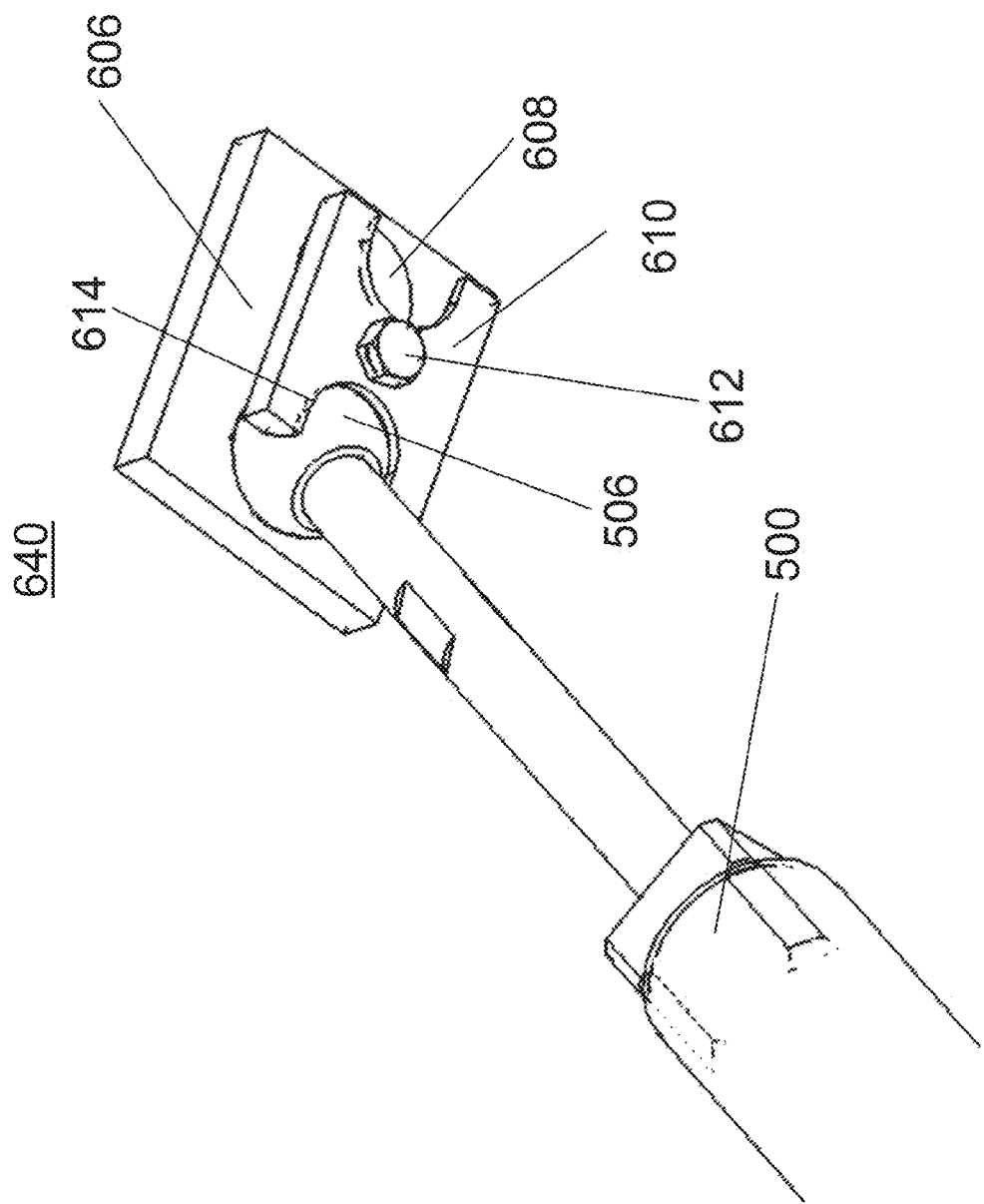
FIG. 6D is a frame connection ball clamp.

FIG. 6D illustrates another implementation of a strut kinematic mount 640 that can be used to join a ball end 506 of a strut 500 to a frame, such as the support frame 120 shown in FIG. 1. The kinematic mount 640 includes many of the same components as kinematic mount 610, 620, and 630, including the plate 606 with conical seats 608, and a clamp 610. However, because the kinematic mount 640 is mounted directly to the support frame 620 rather than to a pile, it does not include a pile connection.

In some implementations, the kinematic mount 600, 620, 630, and 640 described above are configured to substantially eliminate moment loads on the struts 500 used in support strut assembly 400. The struts 500 therefore have to support only tension and compression forces when the strut assembly 400 is installed. This design allows the struts 500 to be manufactured with a significantly smaller cross sectional area, relative to the size that would be required if the struts 500 were also exposed to significant moment loads.

In some embodiments, e.g., as described above, the strut assembly 400 includes six degrees of freedom (e.g., corresponding to one length adjustment for each of the struts 500). This arrangement is particularly advantageous in that it may allow for substantial elimination of moment loads 500 on all struts in the assembly 400. However, is some embodiments, e.g., where some moment loads may be acceptable, fewer degrees of freedom may be used.

Figure 7:
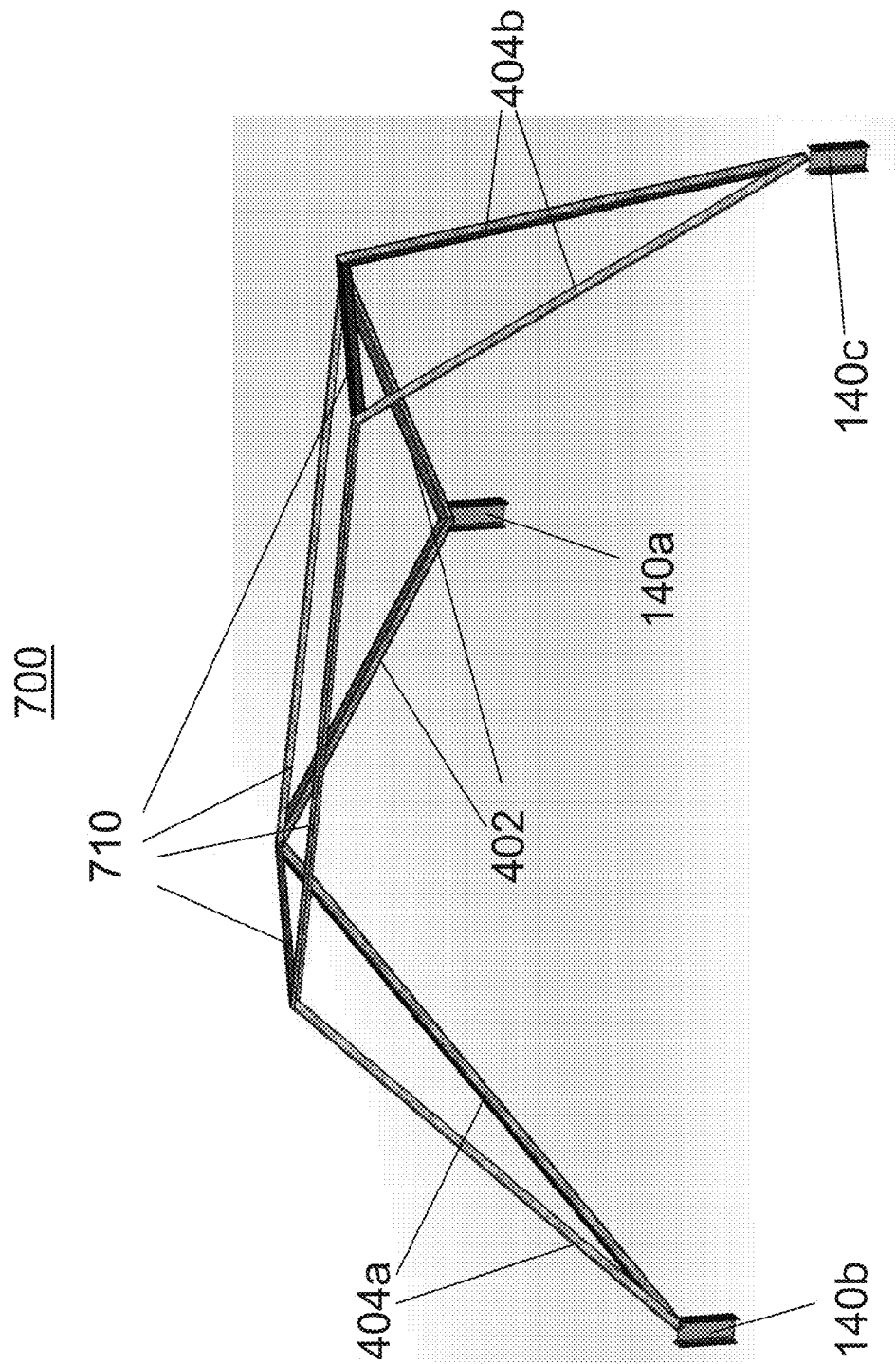
FIG. 7 is a perspective view of a support strut assembly spacer frame.

FIG. 7 illustrates a support strut assembly (SSA) spacer frame 700 for supporting an array of solar panel modules. The SSA spacer frame 700 includes many of the essential components of the support strut assembly 400 of FIGS. 4A-4D, including the front support structure 402 and the side support structures 404a and 404b, each of which can include two struts 500. In some implementations, the SSA spacer frame 700 can also include a cross brace similar to cross brace 406 of FIG. 4A, although such a cross brace is not depicted in FIG. 7. The SSA spacer frame can be mounted on foundational members, such as the foundational members 140a-140c of FIG. 4.

The SSA spacer frame also includes a sub-frame 710. The sub-frame 710 is a rectangular arrangement of four structural members having substantially the same size as the support frame 120 of FIG. 1A. During installation, a ground crew can use the sub-frame 710 to easily align the SSA spacer frame on uneven ground, by aligning the sub-frame exactly as the array of solar panel modules is to be aligned. In some implementations, the SSA spacer frame 700 weighs only about 50 pounds. In contrast, the support frame 120 can weigh several hundred pounds. The SSA spacer frame 700 therefore makes it safe for the ground crew to align and install the SSA spacer frame 700 without the use of heavy lifting equipment, even on an irregular ground surface.

In some implementations, the structural components of the SSA spacer frame have an adjustable length to accommodate installation on an uneven surface. For example, the struts 500 of FIG. 5 can be used as the structural members of the SSA spacer frame 700, and the joints 610, 620, 630, and 640 of FIGS. 6A-6D can be used to join the structural members. The structural members can arrive at the installation site with pre-defined lengths, in order to minimize the amount of adjustment performed by the ground crew during installation.

Figure 8B:
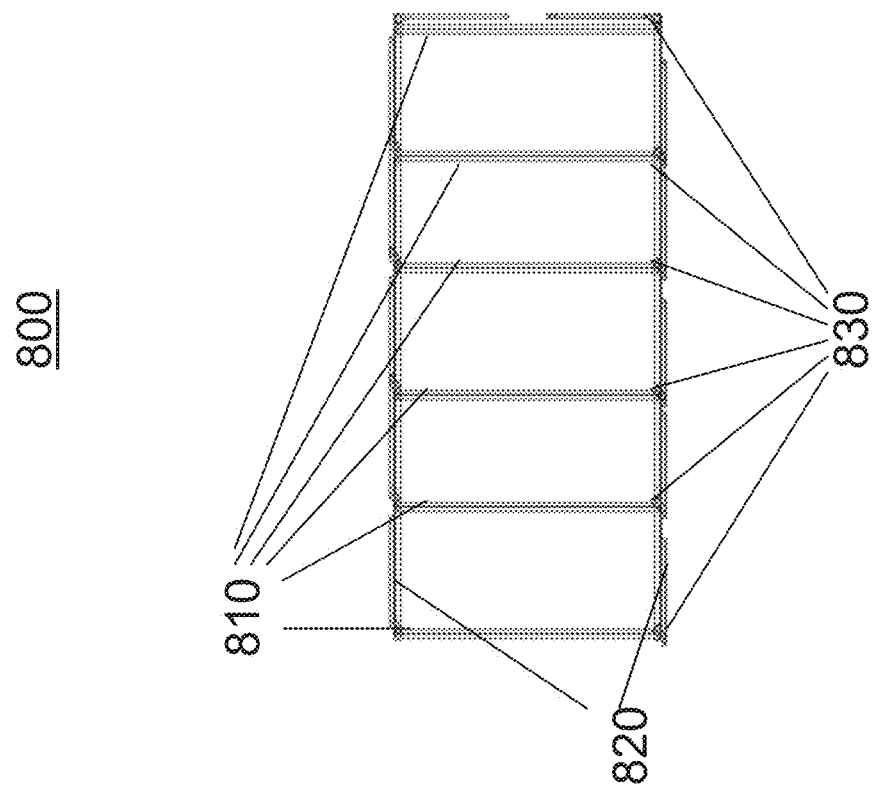
FIG. 8B a top view of the module frame of FIG. 8A configured for shipment.
Figure 8A:
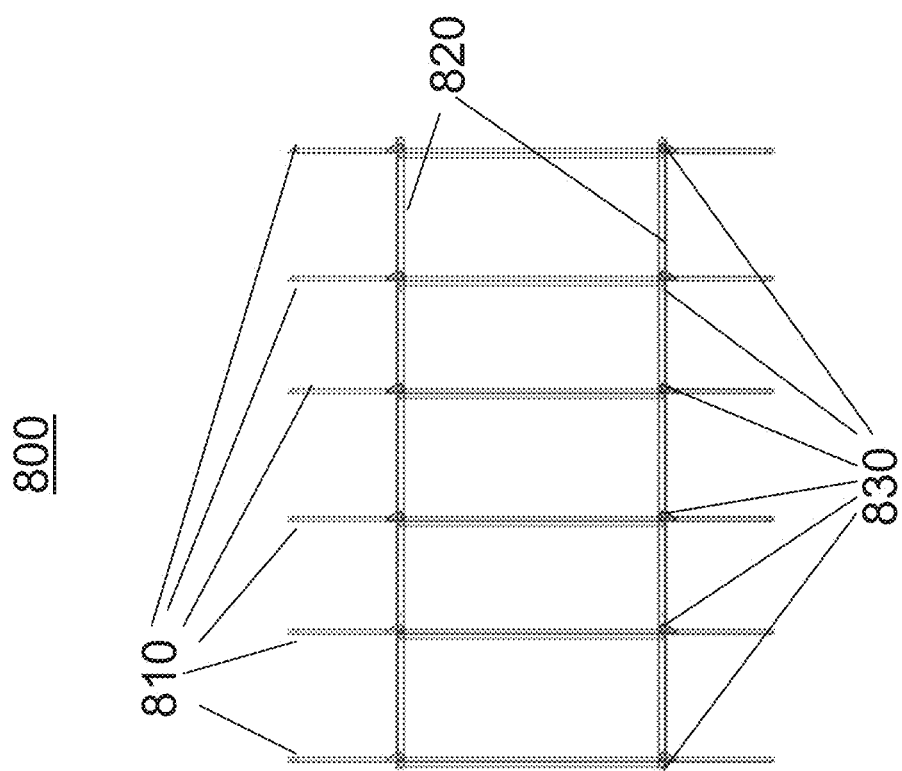
FIG. 8A is a top view of a module frame configured for installation.

FIG. 8A depicts a top view of a module frame 800 configured for installation and use with a solar panel module. For example, the module frame 800 could be used as the module frame 120 of FIG. 1A. The purpose of the module frame 800 is to support an array of solar panel modules in a fixed orientation. As discussed above, the module frame 800 can be mounted onto the support strut assembly 400 or the SSA spacer frame 700. In some implementations, the module frame 800 is connected to the support strut assembly 400 by a joint such as the joint 640 of FIG. 6D.

The module frame 800 includes a plurality of spars 810 and two purlins 820. In some implementations, the purlins 820 are positioned to support the Airy points of the spars 810, as described above in connection with the foundational structures of FIG. 2. The intersection of each spar 800 and each purlin 820 includes a hinge 830. As shown in FIG. 8A, the hinges 830 are in an open configuration for installation, which allows a portion of each spar 810 to extend outward from each purlin 820, maximizing the length of the spars 810 and providing the largest possible surface area for the module frame 800 to support an array of solar panels.

FIG. 8B depicts a top view of the module frame 800 configured for shipment. In this configuration, the hinges 830 are in a closed position, rotated (e.g., through 90 degrees) from the open position shown in FIG. 8A. The portion of each spar 810 that extends beyond the purlins 820 during installation is thus redirected to lie adjacent to the purlins 820. When stowed for shipment in this configuration, the module frame 800 occupies a smaller area than it would in the configuration shown in FIG. 8A. The smaller area allows for the module frame 800 to be shipped more efficiently. Note that in other embodiments, other types of hinged members may be used to allow the overall size of the module frame 800 to be reduced for shipment.

Figure 9B:
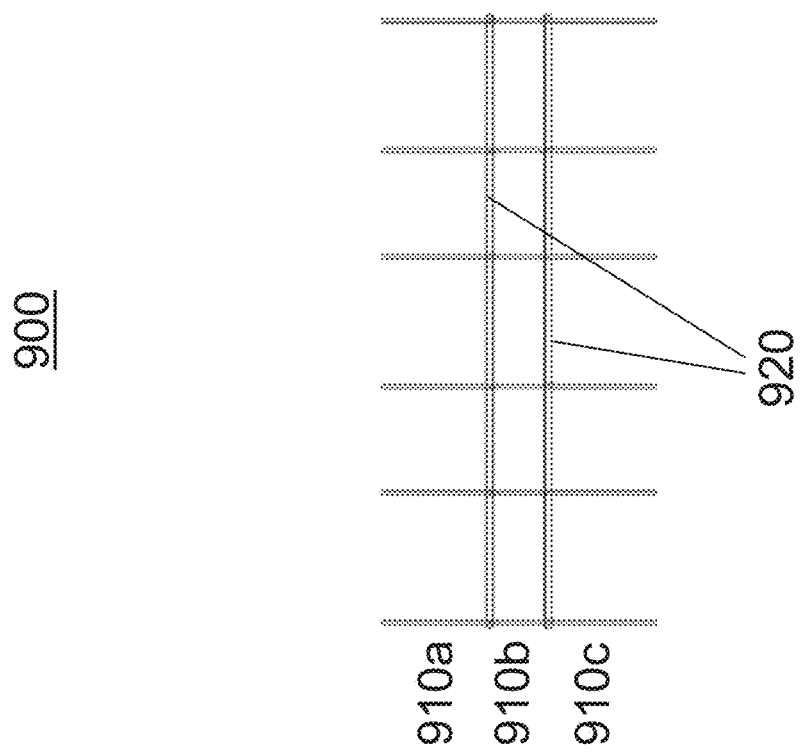
FIG. 9B is a top view of the module frame of FIG. 9A configured for shipment.
Figure 9A:
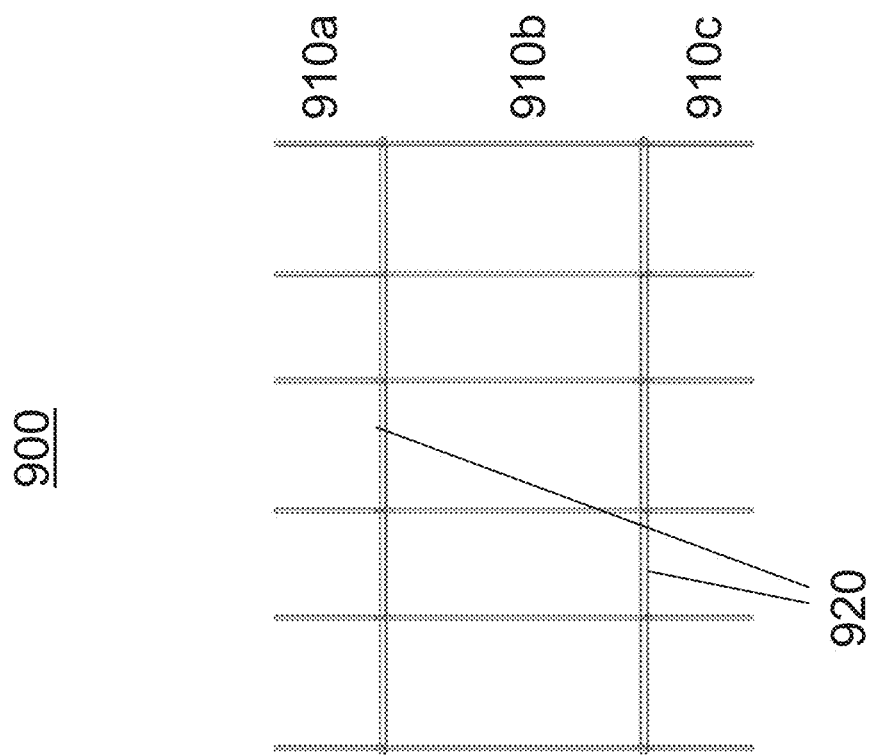
FIG. 9A is a top view of a first alternative module frame configured for installation.

FIG. 9A shows a module frame 900 configured for installation. For example, the module frame 900 could be used as the module frame 120 of FIG. 1A. The purpose of the module frame 900 is to support an array of solar panel modules in a fixed orientation. As discussed above, the module frame 900 can be mounted onto the support strut assembly 400 or the SSA spacer frame 700. In some implementations, the module frame 900 is connected to the support strut assembly 400 or the SSA spacer frame 700 by a joint such as the joint 640 of FIG. 6D.

The module frame 900 includes a plurality of spars, such as the spar 910, which has three pieces 910*a*, 910*b*, and 910*c*. The module frame 900 also includes two purlins 920. In some implementations, the purlins 920 are positioned to support the Airy points of the spars 910, as described above in connection with the foundational structures of FIG. 2. The pieces 910*a*-*c* of the spars 910 have hollow cross sections, and the dimensions of the outer pieces 910*a* and 910*c* are slightly larger than the dimensions of the inner piece 910*b*, such that the inner piece 910*b* can slide inside the outer pieces 910*a* and 910*c*. In some implementations, the spars 910 have circular, C-shaped, U-shaped, or any other suitable cross sections. As shown in FIG. 9A, the outer pieces 910*a* and 910*c* can be arranged to extend outward beyond the purlins 920, maximizing the length of the spars 910 and providing the largest possible surface area for the module frame 900 to support an array of solar panels.

FIG. 9B depicts a top view of the module frame 900 configured for shipment. In this configuration, the inner piece 910*b* slides within the outer pieces 910*a* and 910*c* of the spars 910 decreasing the overall length of the spars 910. When stowed for shipment in this configuration, the module frame 900 occupies a smaller area than it would in the configuration shown in FIG. 9A. The smaller area allows for the module frame 900 to be shipped more efficiently.

Figure 9D:
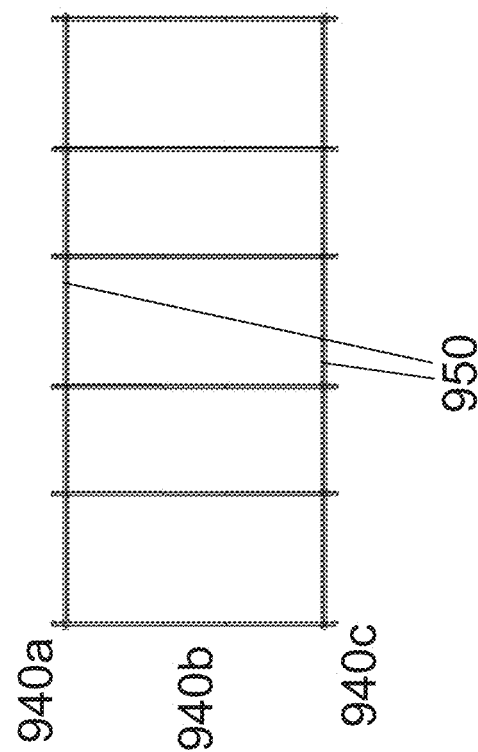
FIG. 9D is a top view of the module frame of FIG. 9C configured for shipment.
Figure 9C:
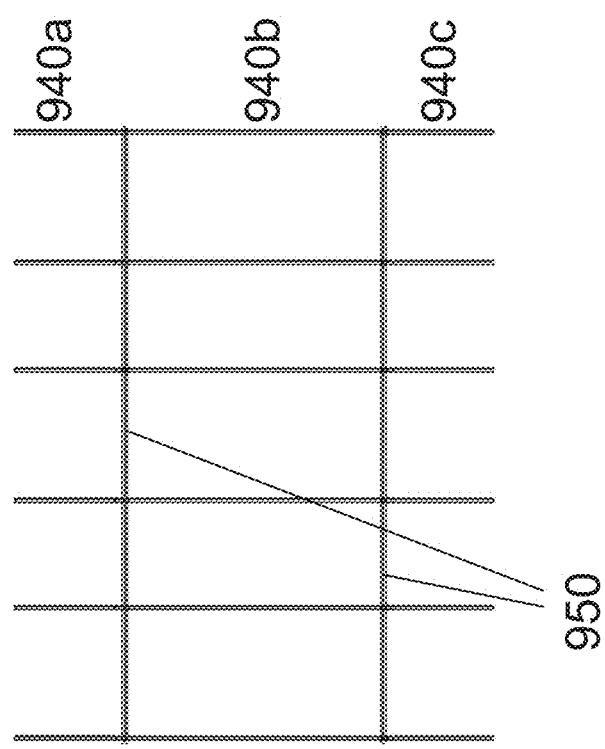
FIG. 9C is a top view of a second alternative module frame configured for installation.

FIG. 9C shows a module frame 930 configured for installation. For example, the module frame 930 could be used as the module frame 120 of FIG. 1A. The purpose of the module frame 930 is to support an array of solar panel modules in a fixed orientation. As discussed above, the module frame 930 can be mounted onto the support strut assembly 400 or the SSA spacer frame 700. In some implementations, the module frame 930 is connected to the support strut assembly 400 by a joint such as the joint 640 of FIG. 6D.

The module frame 930 includes a plurality of spars, such as the spar 940, which has three pieces 940*a*, 940*b*, and 940*c*. The module frame 930 also includes two purlins 950. In some implementations, the purlins 950 are positioned to support the Airy points of the spars 940, as described above in connection with the foundational structures of FIG. 2. The pieces 940*a*-*c* of the spars 940 have hollow cross sections, and the dimensions of the outer pieces 940*a* and 940*c* are slightly smaller than the dimensions of the inner piece 940*b*, such that the outer pieces 940*a* and 940*c* can slide inside the inner piece 940*b*. In some implementations, the spars 940 have circular, C-shaped, or U-shaped cross sections. As shown in FIG. 9C, the outer pieces 940*a* and 940*c* can be arranged to extend outward beyond the purlins 950, maximizing the length of the spars 940 and providing the largest possible surface area for the module frame 930 to support an array of solar panels.

FIG. 9D depicts a top view of the module frame 930 configured for shipment. In this configuration, the outer pieces 940*a* and 940*c* slide into the inner piece 940*b* of the spars 940, decreasing the overall length of the spars 940. The purlins 950 remain in a fixed position. When stowed for shipment in this configuration, the module frame 930 occupies a smaller area than it would in the configuration shown in FIG. 9C. The smaller area allows for the module frame 930 to be shipped more efficiently.

Figure 10B:
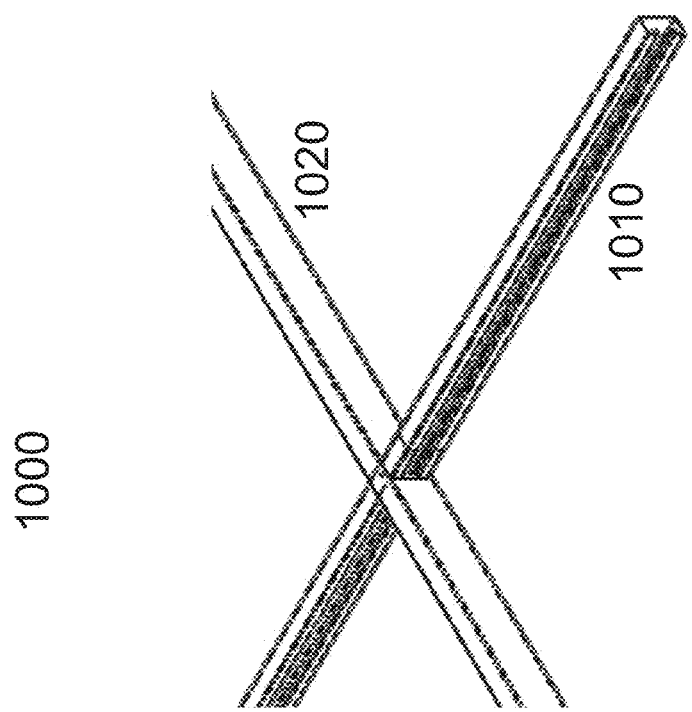
FIG. 10B is an enlarged view of a portion of the nested module frame of FIG. 10A.
Figure 10A:
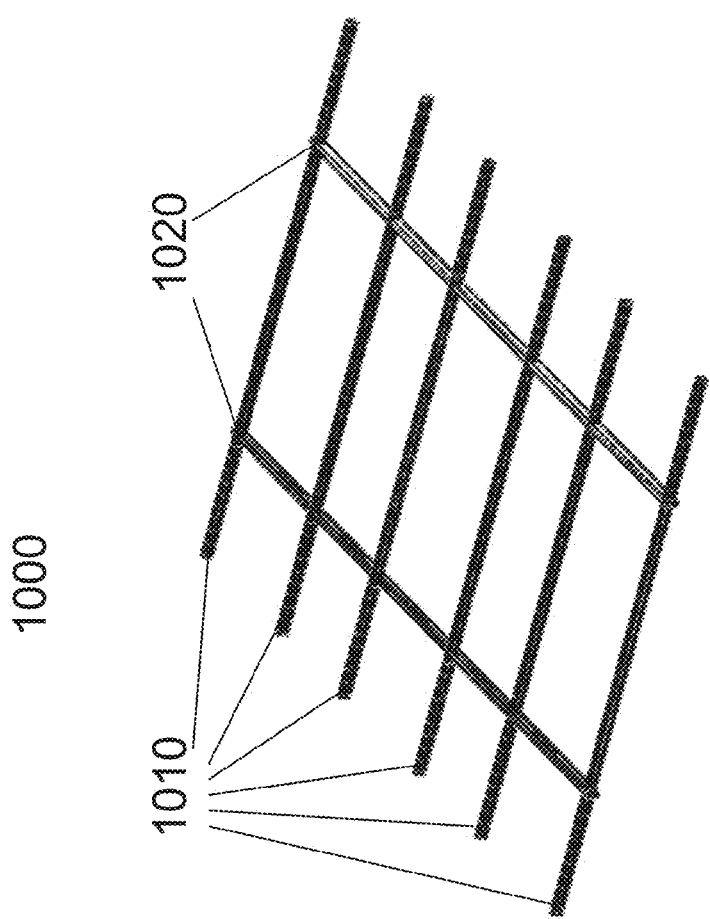
FIG. 10A is a perspective view of a nested module frame.

FIG. 10A depicts a module frame 1000. The module frame 1000 could be used as the module frame 120 of FIG. 1A. The purpose of the module frame 1000 is to support an array of solar panel modules in a fixed orientation. As discussed above, the module frame 1000 can be mounted onto the support strut assembly 400 or the SSA spacer frame 700. In some implementations, the module frame 1000 is connected to the support strut assembly 400 by a joint such as the joint 640 of FIG. 6D. The module frame 1000 includes spars 1010 and purlins 1020.

FIG. 10B depicts an enlarged view of the intersection of a spar 1010 and a purlin 1020 of FIG. 10A. The spar 1010 and purlin 1020 are nested, such that the spar 1010 passes directly through the purlin 1020. This is in contrast with the typical way in which spars and purlins are stacked on top of each other. The nested configuration of the spar 1010 and purlin 1020 of FIG. 10B reduces the total height of the module frame 1000, which can result in more efficient shipping of large quantities of module frames 1000. In addition, the nested configuration allows both flanges of the spar 1010 to be supported by the purlin 1020, resulting in a more rigid module frame 1000. The nested configuration shown in FIGS. 10A and 10B could be used in connection with other features described above, such as the module frames discusses in connection with FIGS. 8A-B and 9A-B.

Figure 11A:
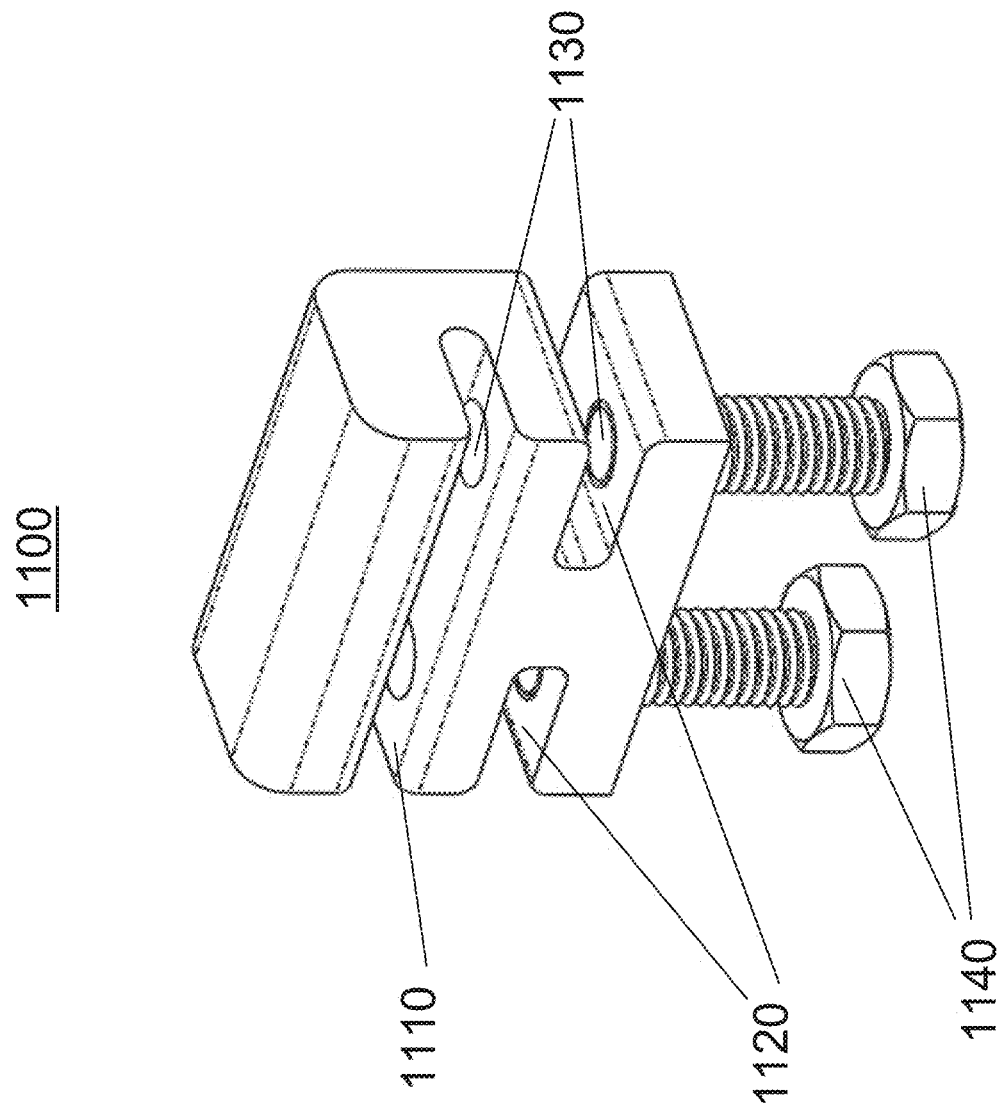
FIG. 11A is an under-clamp for securing a module frame to a spar.

FIG. 11A depicts a perspective view of an underclamp 1100 for securing a solar panel module to a module frame, such as the module frame 120 of FIG. 1A. The underclamp 1100 includes a module slot 1110 located at a top portion of the underclamp 1100 and two frame slots 1120 located beneath the module slot. Threaded cutouts 1130 extend through each of the frame slots 1120 and into the module slot 1110. Bolts 1140 are mechanically coupled to the threaded cutouts 1130.

Figure 11B:
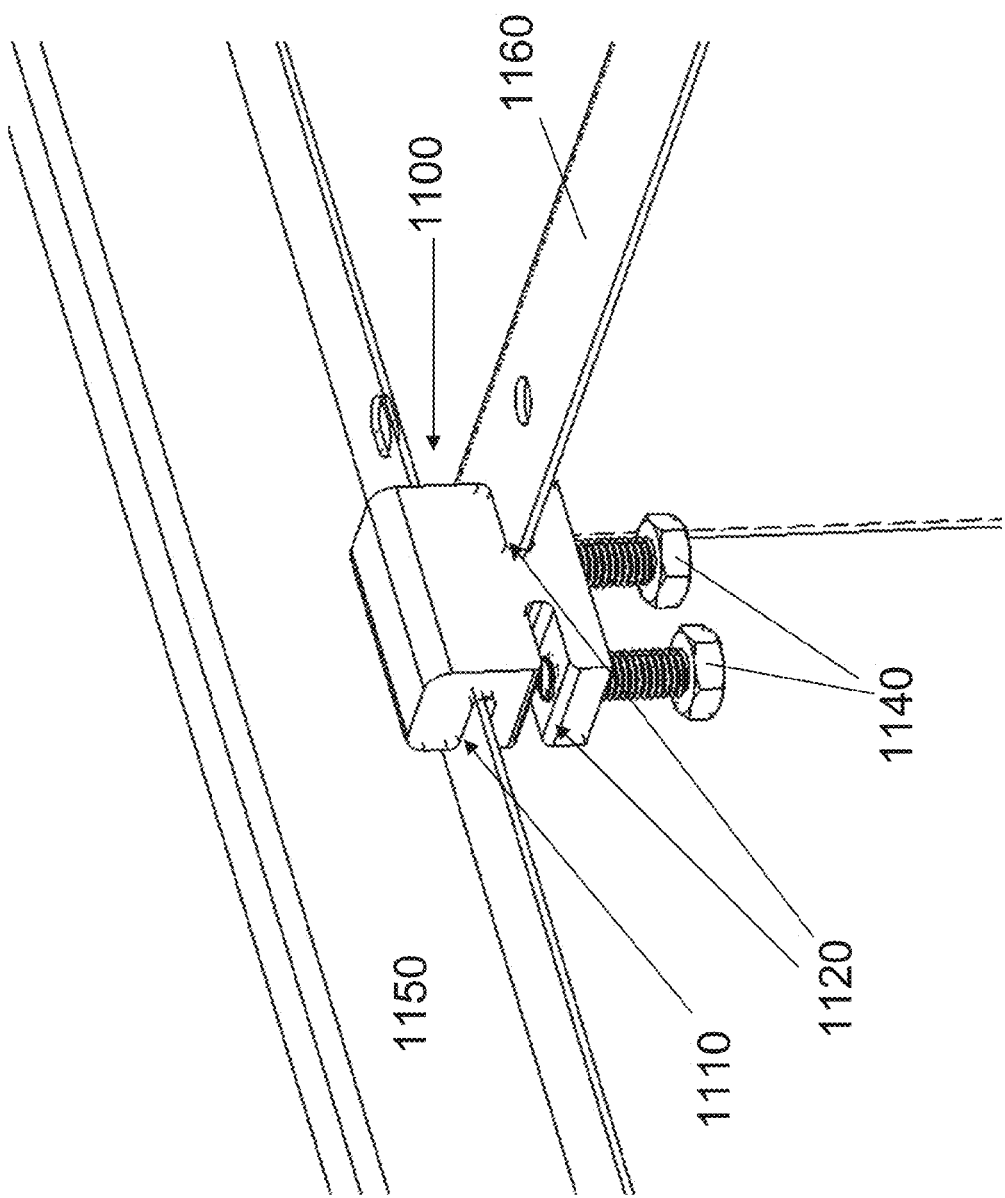
FIG. 11B is the under-clamp of FIG. 11A installed to secure a module frame and a spar.

FIG. 11B depicts the underclamp 1100 installed to join a solar panel module 1150 and a module frame. The module frame includes a spar 1160. As shown in FIG. 11B, a flange on the solar panel module 1150 can be inserted into the module slot 1110, and a flange of the spar 1160 can be inserted into the frame slot 1120. Both of the bolts 1140 can then be tightened to secure the solar panel module 1150 and the module frame in place.

As discussed above, the solar panel module 1150 and the spar 1160 can be made of an electrically conductive material with an outer coating, such as an anodized coating or a galvanized coating. In some implementations, the underclamp 1100 and the bolts 1140 can be made of a conductive material, such as stainless steel or aluminum. The bolts 1140 can pierce the coatings on the solar panel module 1150 and the spar 1160 as they are tightened, such that all of the components of the system are electrically connected. An electrical connection to ground can then be attached to any of the system components to reduce the risk of electrical shock to workers who install or maintain the solar panel module 1150, and also to protect the electrical components of the solar panel module 1150. In some implementations, the bolts 1140 can be tightened so that they pass completely through either or both of the spar 1160 and the solar panel module 1150.

FIGS. 12A and 12B show a side view and a perspective view, respectively, of an overclamp 1200 for securing a solar panel module to a module frame, such as the module frame 120 of FIG. 1A. The overclamp 1200 includes a flange 1210 and a U-shaped member 1220 mechanically coupled by a bolt 1230. A solar panel module 1240 can be secured between a bottom edge of the flange 1210 and a top surface of the U-shaped member 1220 by loosening or tightening the bolt 1230. A spar 1250 of a module frame can be secured within the U-shaped member 1220, as shown in FIG. 12A.

In some implementations, the U-shaped member 1220 is made from a rigid material and the spar 1250 must slide through the opening in the U-shaped member 1220. In other implementations, the U-shaped member 1220 is made from a flexible material and includes angled teeth 1260, allowing the U-shaped member 1220 to flex over the width of the spar 1250 and snap into place around the spar 1250. In yet another implementation, the vertical sides of the U-shaped member 1220 can be coupled to the top surface of the U-shaped member 1220 by hinges, which can open and close around the spar 1250. While the spar 1250 is shown with a square cross section in FIGS. 12A and 12B, other shapes can also be used for the spar 1250. In instances where another shape is used for the spar 1250, the shape of the U-shaped member can be varied to match the shape of the spar 1250, so that the spar 1250 can be held securely in place.

Figure 13A:
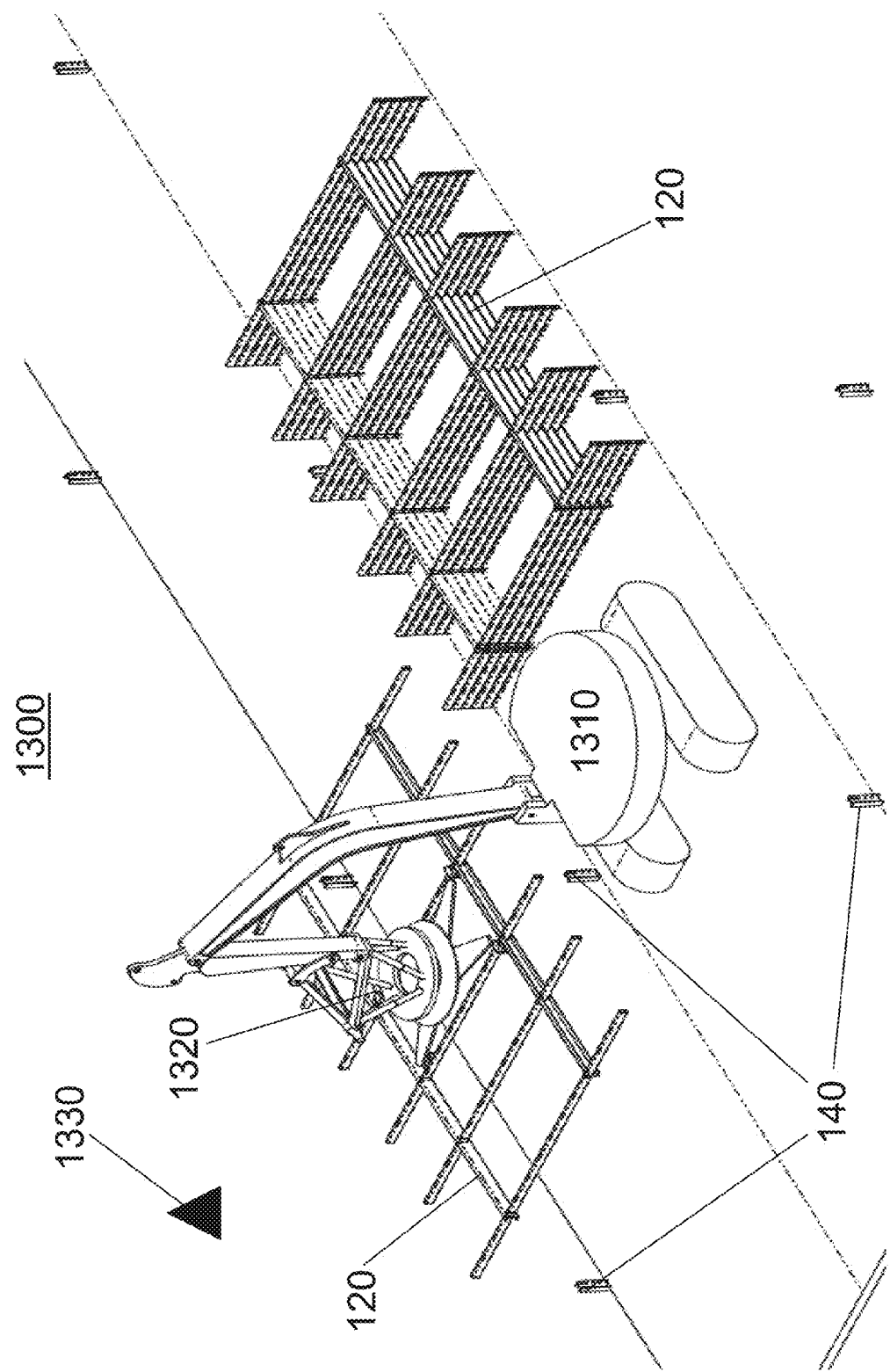
FIG. 13A is a system for automating the installation of an array of solar panel modules.

FIG. 13A depicts a system 1300 for automating a portion of the installation process for an array of solar panel modules. The system includes an excavator 1310, a hexapod 1320, and a survey station 1330. Foundational supports, such as the foundational supports 140 of FIG. 1A, can be preinstalled by a ground crew. A stack of module frames, such as module frames 120, can be placed next to the excavator 1310 or can be stacked on a trailer attached to the excavator 1310.

The hexapod 1320 can be configured to lift a single module frame 120 from the stack of module frames 120. The frame 120 can then be roughly positioned via the hydraulic arm of the excavator 1310. In some implementations, the frame 120 can be positioned within about one foot of its final location by the excavator 1310. The survey station 1330 can then determine the current rough position of the frame 120 and the more accurate position required for installation. In some implementations, the hexapod 1320 can also include position sensors to help determine the position of the frame 120. These positions can be transmitted from the survey station 1330 to the hexapod 1320.

In some embodiments, the survey station may determine the position of the frame 120 very accurately, e.g., with an accuracy of 1 m or less, 0.1 m or less, 0.01 m or less, 0.001 m or less, 0.0001 meters or less, 0.00001 m or less, 0.000001 m or less, 0.0000001 m or less, e.g., in the range of 0.1 mm to 10 cm or any subrange thereof. In some embodiments, the survey station may accurately determine the orientation of the frame. For example, in some embodiments, the survey station may determine each of the roll, pitch and yaw of the frame with an accuracy of at least 5.0 degrees, 1.0 degree, 0.1 degrees, 0.01 degrees, 0.001 degrees, 0.0001 degrees or less, e.g., in the range of 0.0001 degrees to 5 degrees, or any subrange thereof.

In various embodiments, the survey station may be a total survey station of the type know in the art, e.g., the TPS line of survey stations available from Leica Geosystems (http://www.leica-geosystems.com).

In some embodiments, the total station is an electronic/optical instrument that includes an electronic theodolite (transit) integrated with an electronic distance meter (EDM) to determine the position and orientation of an object relative to the instrument, or some other reference point. In some embodiments, a target, e.g., a reflective target such as a prism cube may be attached to the hexapod to aid in detecting the position of the frame 120. Robotic total stations allow the operator to control the instrument from a distance via remote control.

In some embodiments, the position information may include the position of the center of mass of the frame 120 in space (e.g., its x, y, and z spatial coordinates in a rectilinear coordinate system) along with the roll, pitch and yaw of the frame. Advantageously, these six degrees of freedom fully define the position and orientation of the frame in space relative to a reference point (e.g., the survey station). In other embodiments, alternative coordinate and orientation system may be used. In some embodiments, e.g., in applications where the precise positioning of the frame 120 is not critical, position information including fewer than six degrees of freedom may be used.

Figure 13B:
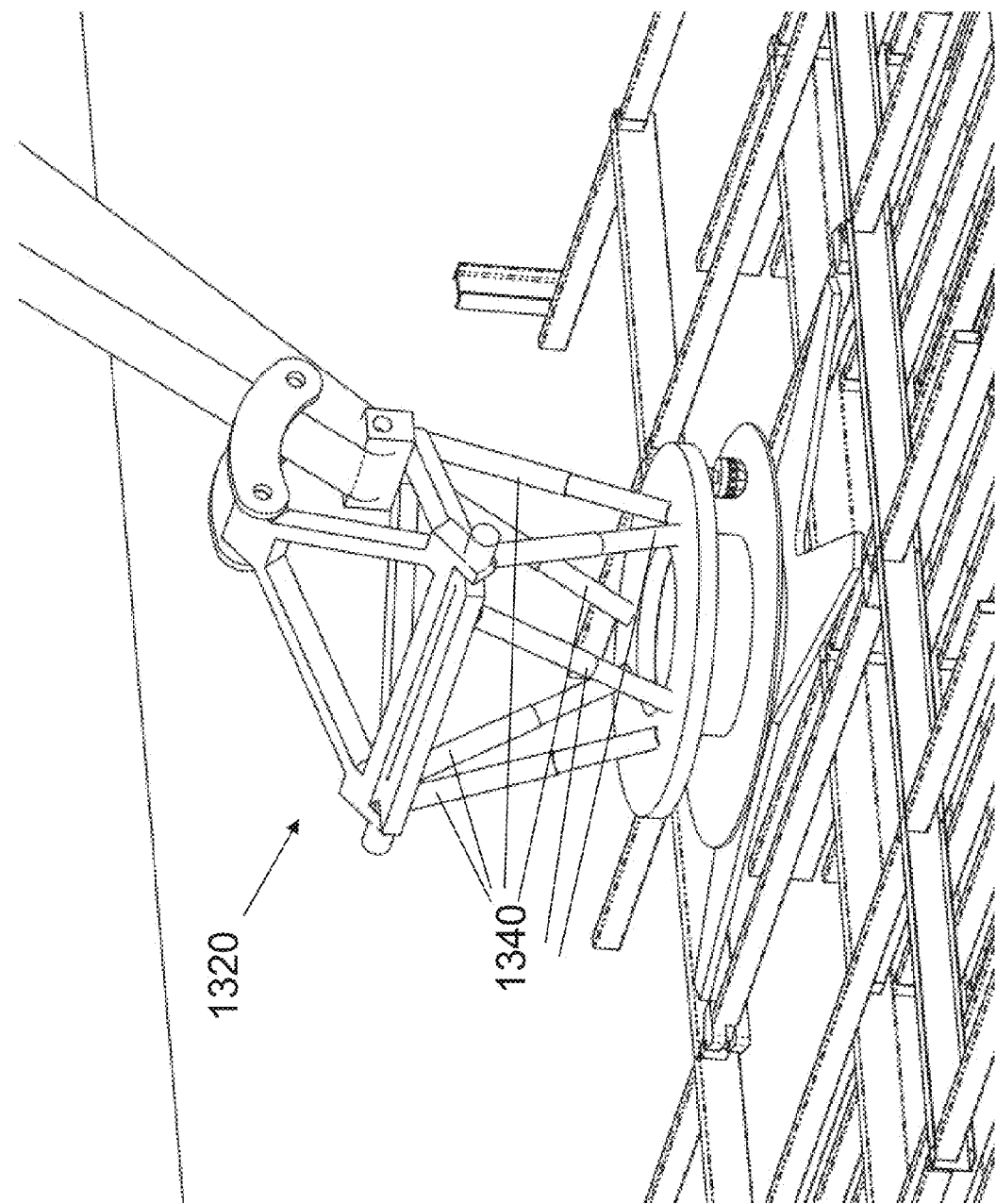
FIG. 13B is an enlarged view of a hexapod used in the system of FIG. 13A.

As shown in FIG. 13B, the hexapod 1320 has six hydraulic legs 1340. A control system can command the legs 1340 to actuate, precisely positioning the frame 120 for installation. In some implementations, the hexapod 1320 receives power (e.g., electrical or hydraulic power) from the excavator 1310. When the frame 120 has been accurately positioned, a ground crew can perform installation of the support strut assembly 400 of FIGS. 4A-4D. Because the frame 120 is held securely in its final location, the installation procedure performed by the ground crew is greatly simplified. For example, the ground crew can see exactly where the joints of the support strut assembly 400 must be positioned, and can adjust the lengths and angles of the struts accordingly. Furthermore, because the relatively heavy module frame is held in place by the hexapod 1320, the ground crew can install the support strut assembly 400 and attach it to the module frame 120 without any special heavy lifting equipment.

Although in the examples above, a hexapod 1320 was used to position the frame 120, in other embodiments, other positioning devices may be used, e.g., an articulated robotic arm.

Figure 14:
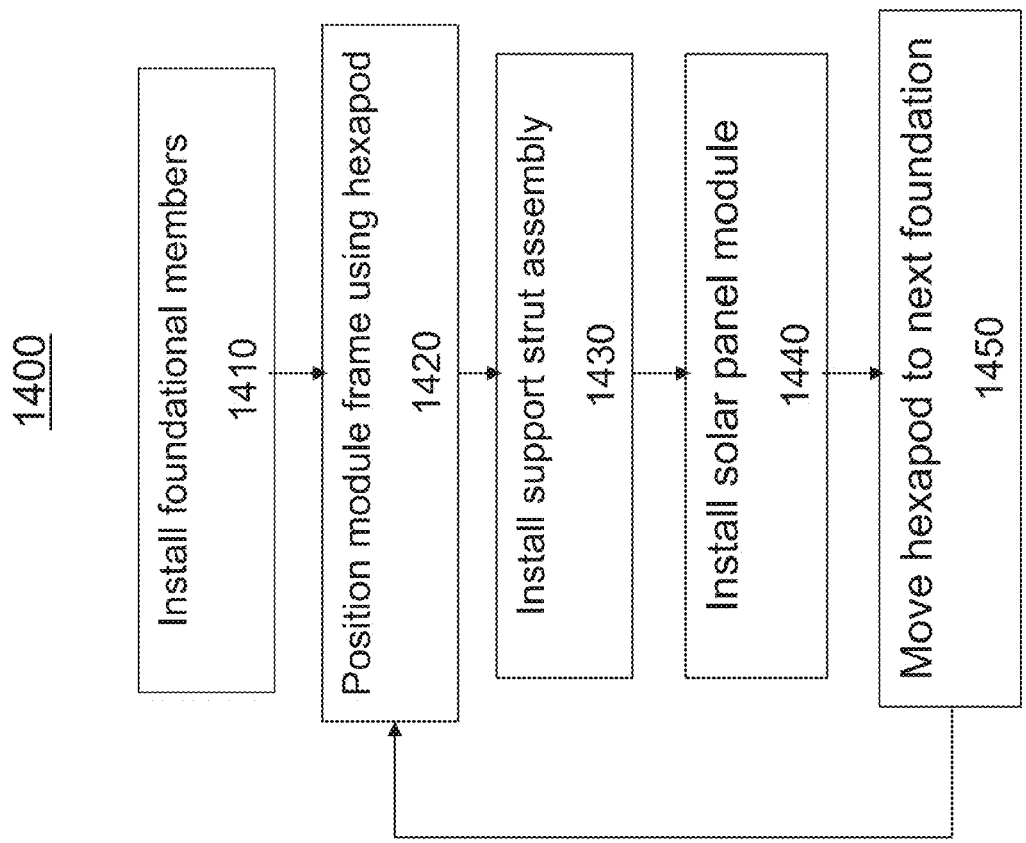
FIG. 14 is an automated method for installing an array of solar panel modules.

FIG. 14 is a method 1400 for automating the installation of an array of solar panel modules. The method includes the step of installing foundational members (BLOCK 1410). In instances where a plurality of solar panel modules are to be installed, the foundational members for all of the solar panel module can be installed at once. For example, FIG. 13A depicts rows of foundation members 140 that have been preinstalled. As described above in connection with FIG. 2, the foundational members can be installed in a triangular configuration, such that the rear foundational members will support the rear two Airy points of each solar panel module. In some implementations, the foundational members can be any of the structures shown in FIGS. 3A-3C, such as the helical pile 300, the I-beam 310, or the earth screw 320.

The method 1400 includes the step of positioning a module frame using the hexapod (BLOCK 1420). As described above in connection with FIG. 14, a module frame can be picked up by a hexapod and roughly positioned by an excavator. The hexapod can then communicate with a survey station to more accurately position the frame for installation.

The method 1400 includes the step of installing the support strut assembly (BLOCK 1430), such as the support strut assembly 400 of FIGS. 4A-4D. The support strut assembly can have adjustable struts and joints to facilitate installation on uneven terrain. A ground crew can connect the support strut assembly to the foundational structures that were previously installed (BLOCK 1410). The lengths of the struts and angles of the joints can then be adjusted by the ground crew such that the upper section of the support strut assembly aligns with the module frame, which is held in its correct position by the hexapod.

The method 1400 includes the step of installing a solar panel module (BLOCK 1440). The support structure, including the foundation, the support strut assembly, and the module frame, has already been installed. A ground crew can thus install a solar panel module onto the support structure. In some implementations, the solar panel module is installed using one or both of the underclamp 1100 of FIGS. 11A and 11B and the overclamp 1200 of FIGS. 12A and 12B.

The method 1400 also includes the step of moving the hexapod to a subsequent foundation (BLOCK 1450). If there are solar panel modules or frames remaining to be installed, the excavator can be moved to the next foundation. In some implementations, the excavator can tow a trailer on which additional module frames are stacked. The method 1400 can then return to BLOCK 1420 to complete the installation for the next foundation.

In some implementations, the steps of the method 1400 can be performed in a different order than is presented in FIG. 14. For example, it may not be necessary to install a solar panel module (BLOCK 1440) before moving the hexapod to the next foundation (BLOCK 1450). The steps requiring use of the hexapod may be performed in sequence before any solar panel modules are installed (BLOCK 1440), and manual installation steps can be performed subsequently.

Figure 15:
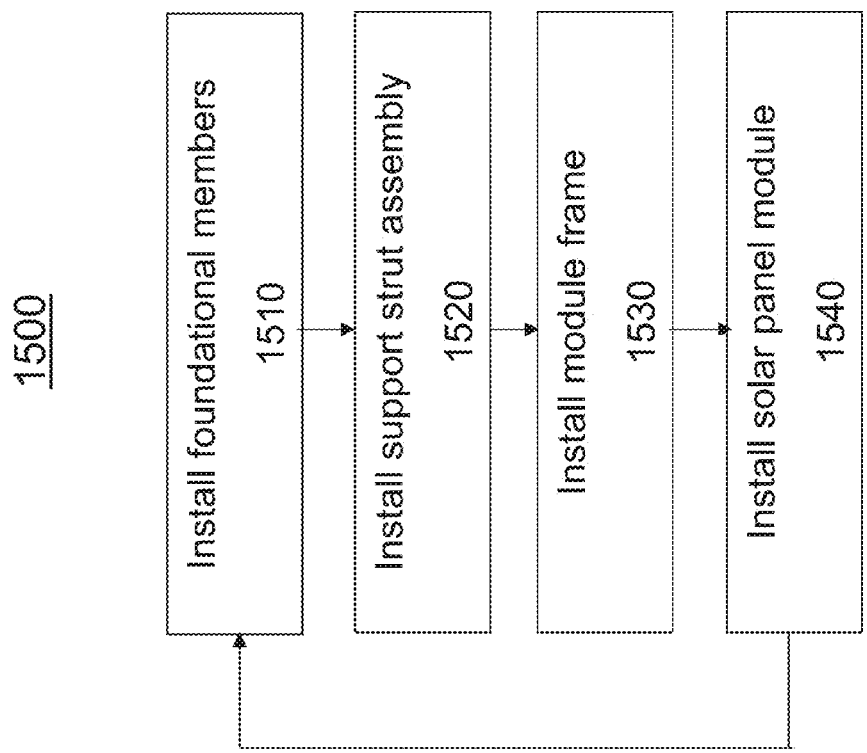
FIG. 15 is a manual method for installing an array of solar panel modules.

FIG. 15 is a method for manually installing an array of solar panel modules. The method 1500 includes the step of installing foundational members (BLOCK 1510). In instances where a plurality of solar panel modules is to be installed, the foundational members for all of the solar panel modules can be installed at once. As described above in connection with FIG. 2, the foundational members can be installed in a triangular configuration, such that the rear foundational members will support the rear two Airy points of each solar panel module. In some implementations, the foundational members can be any of the structures shown in FIGS. 3A-3C, such as the helical pile 300, the I-beam 310, or the earth screw 320.

The method 1500 includes the step of installing the support strut assembly (BLOCK 1520), such as the support strut assembly 400 of FIGS. 4A-4D. The support strut assembly can have adjustable struts and joints to facilitate installation on uneven terrain. A ground crew can connect the support strut assembly to the foundational structures that were previously installed (BLOCK 1510). The lengths of the struts and angles of the joints can then be adjusted by the ground crew such that the upper section of the support strut assembly defines a plane on which a module frame can subsequently be installed.

The method 1500 includes the step of installing a module frame (BLOCK 1530). Having already installed the support strut assembly in its correct orientation (BLOCK 1520), the module frame can be installed onto a top portion of the support strut assembly.

In some implementations, the steps of the method 1500 can be performed in a different order than is presented in FIG. 15. For example, it may not be more efficient to install the foundational members (BLOCK 1510) for a plurality of module mount assemblies, before installing any of the strut assemblies (BLOCK 1520), frames (BLOCK 1530), or solar panel modules (BLOCK 1540).

The method 1500 also includes the step of installing a solar panel module (BLOCK 1540). The support structure, including the foundation, the support strut assembly, and the module frame, has already been installed. The ground crew can thus install a solar panel module onto the support structure. In some implementations, the solar panel module is installed using one or both of the underclamp 1100 of FIGS. 11A and 11B and the overclamp 1200 of FIGS. 12A and 12B.

In some implementations, alignment of the components of the solar panel array may be adjusted at various points in the method 1500. For example, the method 1500 can be performed as described above, and a electronic or optical positioning equipment can be used to determine whether the array of solar panels is properly aligned. If a misalignment is detected, the lengths of some or all of the struts can be adjusted to compensate such that the array is correctly aligned.

In some other implementations, positioning equipment can be used to determine the locations of the foundational members in three-dimensional space immediately after they are installed. Knowledge of the locations of the locations of the foundational members, combined with knowledge of the desired orientation of the solar panel array, can be used to compute the necessary adjustments for the struts and other components. The struts can then be adjusted accordingly, either before or after they are installed on the foundational members. Alignment techniques such as those described above can help to maintain proper orientation of the solar panel array, particularly when the array is to be installed on an uneven surface.

Figure 16A:
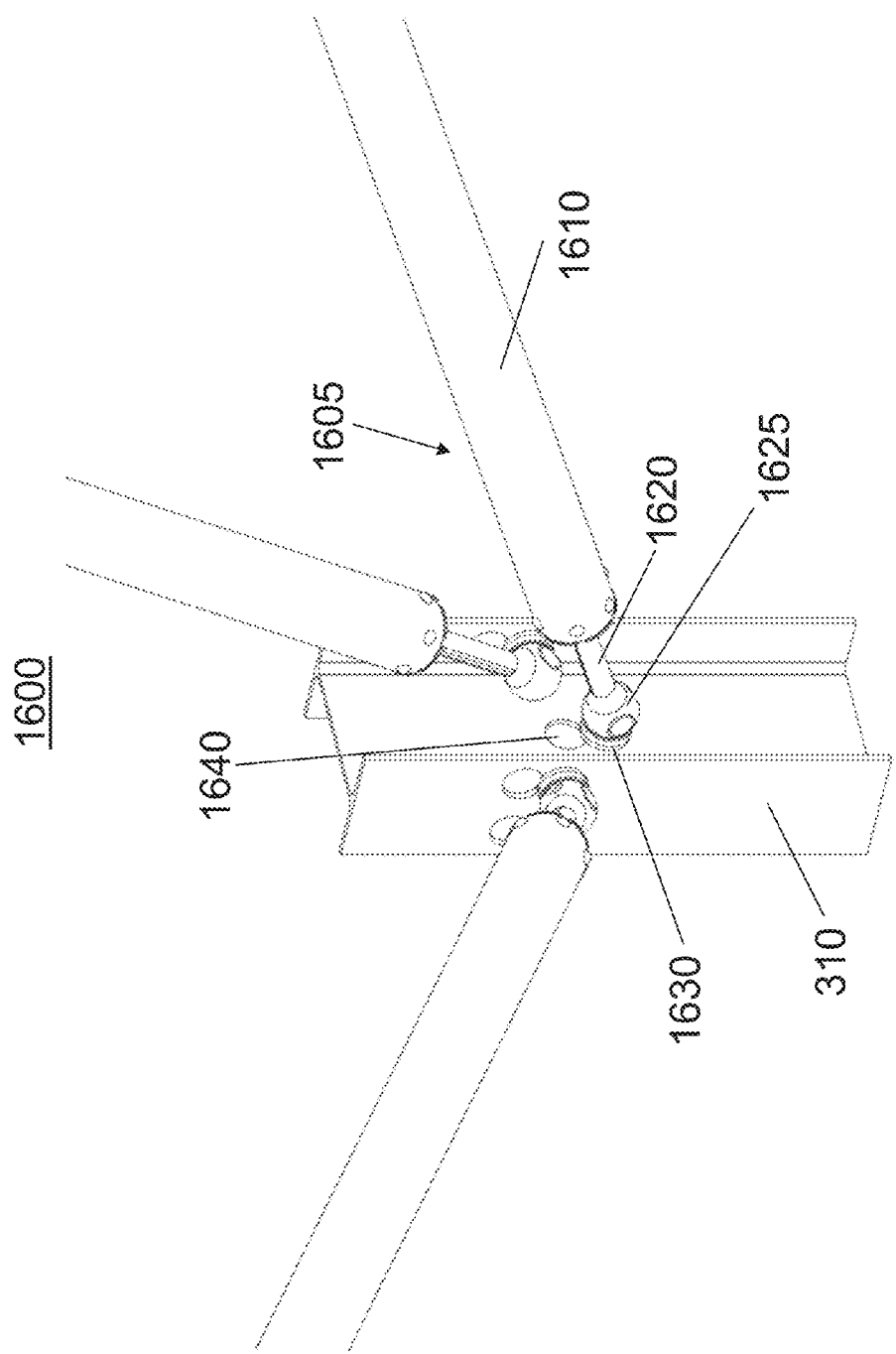
FIG. 16A is a perspective view of a strut-pile connection.

FIG. 16A is a perspective view of a strut-pile connection 1600, according to an illustrative implementation. The connection 1600 can be used to join components, such as the helical pile 300 of FIG. 3A, the I-beam pile 310 of FIG. 3B, or the earth screw 320 of FIG. 3C with struts, such as the struts of the strut support assembly 400 shown in FIG. 4A. In some implementations, the piles or earth screws can serve the function of the foundational members 140 of FIG. 1A.

As shown in FIG. 16A, a strut, such as strut 1605, can include a hollow tube 1610, a threaded rod 1620 having a spherical end 1625, and a spherical washer 1630. Additional features and functionality of the strut 1605 are described in connection with FIGS. 16B-16E below. The I-beam pile 310 can include keyhole cutouts such as the keyhole cutout 1640 into which a portion of the strut 1605 can be inserted and secured. Any number of keyhole cutouts 1640 can be present on the various surfaces of the I-beam pile 310, allowing multiple struts 1605 to be attached to the pile 310. The location and orientation of the keyhole cutouts 1640 can be adjusted to allow for differing orientations of the struts 1605. Although an I-beam pile 310 is shown in FIG. 16A, a pile of any shape could be substituted.

Figure 16B:
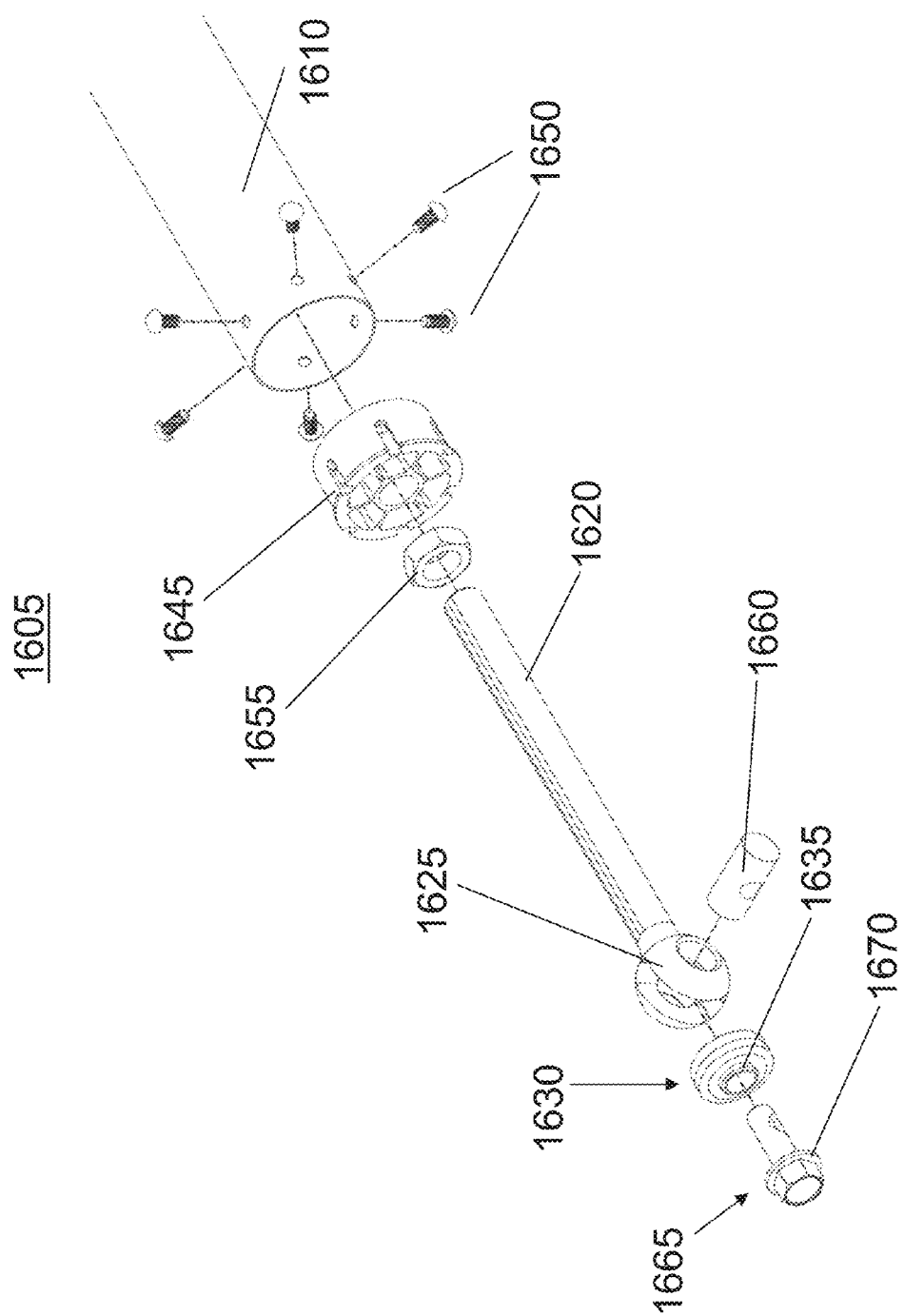
FIG. 16B is an exploded view of a strut for use in the strut-pile connection of FIG. 16A.

FIG. 16B is an exploded view of a strut 1605 for use in the strut-pile connection 1600 of FIG. 16A, according to an illustrative implementation. The strut 1605 includes a hollow tube 1610, a threaded rod 1620 having a spherical end 1625, a spherical washer 1630 having a cylindrical seat 1635, a threaded insert 1645, screws 1650, a nut 1655, a barrel nut 1660, and a bolt 1665 having a flange 1670. When the strut 1605 is assembled, the threaded insert 1645 is inserted into the hollow tube 1610 and secured with the screws 1650. The threaded rod 1620 is inserted through both the nut 1655 and the threaded insert 1645. The length of the strut 1605 can be adjusted by rotating the threaded rod 1620 clockwise or counterclockwise within the threaded insert 1645. In some implementations, some of the threads on the threaded rod 1620 can be modified after it has been inserted into the nut 1655 and the threaded insert 1645. For example, the structure of the threads at the end of the threaded rod 1620 opposite the spherical end 1625 can be altered in order to prevent the threaded rod 1620 from passing back through the threaded insert 1645. This can help to increase safety by preventing the assembled strut 1605 from separating into two pieces after assembly, while still for the length of the strut 1605 to be adjusted.

The spherical end 1625 of the threaded rod 1620 includes a cutout into which the barrel nut 1660 is inserted. The bowl-shaped surface of the spherical washer 1630 is then placed in contact with the spherical end 1625 of the threaded rod 1620, and the bolt 1665 is inserted through the spherical washer 1630 and through the barrel nut 1660. The flange 1670 of the bolt 1665, as well as the cylindrical seat 1635 of the spherical washer 1630, help to secure the strut 1605 to a pile in the strut-pile connection 1600.

Figure 16C:
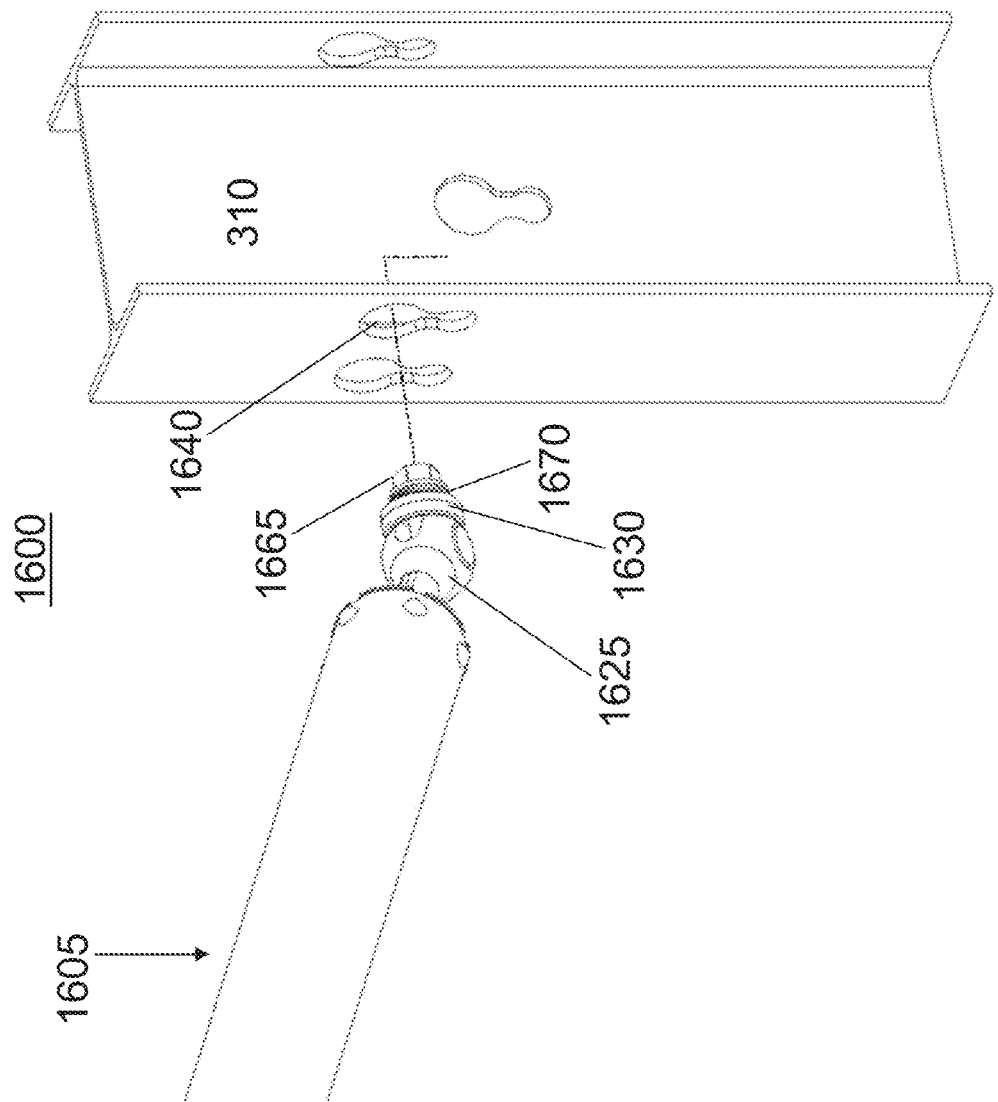
FIG. 16C is perspective view of a strut-pile connection prior to installation of the strut.

FIG. 16C is a perspective view of a strut pile connection 1600 prior to installation of the strut 1605, according to an illustrative implementation. The components of the strut 1605 are assembled as discussed above in connection with FIG. 16B. The bolt 1665 is only partially tightened, so that a gap remains between the flange 1670 and the spherical washer 1630. The bolt 1665 is then inserted into the keyhole cutout 1640 of the pile 310.

The keyhole cutout 1640 includes a larger upper region and a smaller lower region. The diameter of the large upper region is greater than the diameter of the flange 1670, but smaller than the diameter of the spherical washer 1630, which allows the bolt 1665 to pass through the larger upper region of the keyhole cutout 1640 but prevents the spherical washer 1630 from also passing through. The entire strut 1605 is then moved down and seated into the smaller lower region of the keyhole cutout 1640, which has a diameter smaller than the diameters of both the spherical washer 1630 and the flange 1670. The bolt 1665 can then be tightened completely, securing the strut 1605 to the pile 310. The spherical end 1625 of the threaded rod 1620 can move freely within the spherical washer 1630, allowing the strut 1605 to move while remaining secured to the pile 310.

An advantage of the strut-pile connection 1600 is that the strut 1605 can be delivered to the installation site fully assembled as described in connection with FIG. 16B. Field technicians therefore do not have to be concerned with obtaining loose fasteners, such as the bolt 1665, in order to secure the strut 1605 to the pile 310. The installation process is therefore simplified and the risk of misplacing small mechanical fasteners at the installation site is minimized.

Figure 16D:
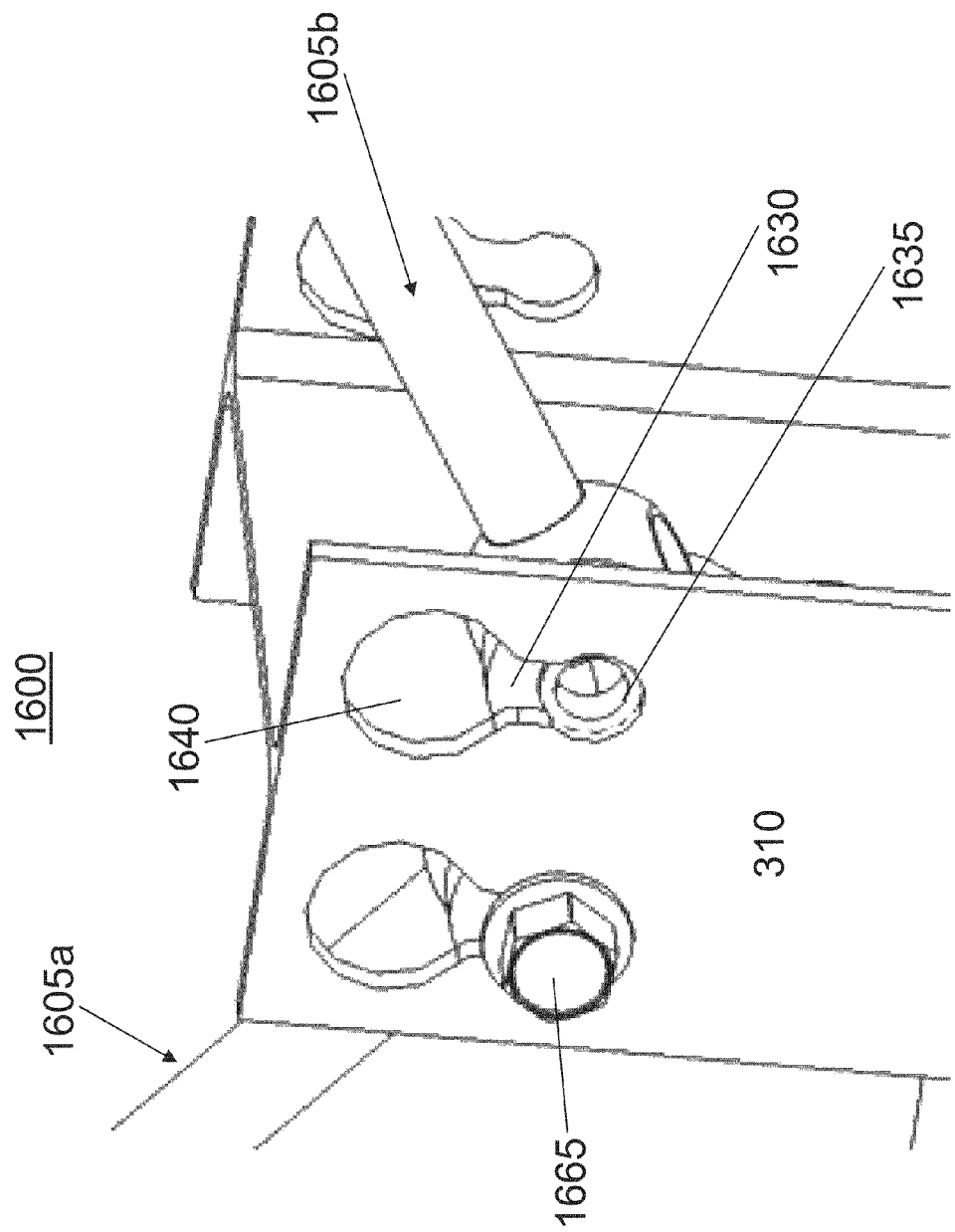
FIG. 16D is an enlarged view of a strut-pile connection.

FIG. 16D is an enlarged view of the strut-pile connection 1600, according to an illustrative implementation. Two struts, 1605*a* and 1605*b*, are shown. For clarity, strut 1605*b* is shown without the bolt 1665 attached. Typically, the bolt 1665 is installed on the strut 1605*b* when the strut 1605 arrives at the installation site, as described above.

As can be seen on strut 1605*b*, the cylindrical seat 1635 of the spherical washer 1630 can be inserted into the smaller lower region of the keyhole cutout 1640. In some implementations, the diameter of the cylindrical seat 1635 is substantially equal to the diameter of the lower region of the keyhole cutout 1640 so that the strut 1605*b* cannot move up or down within the keyhole cutout 1640. Strut 1605*a* is shown in its fully installed configuration, secured by the bolt 1665.

Figure 16E:
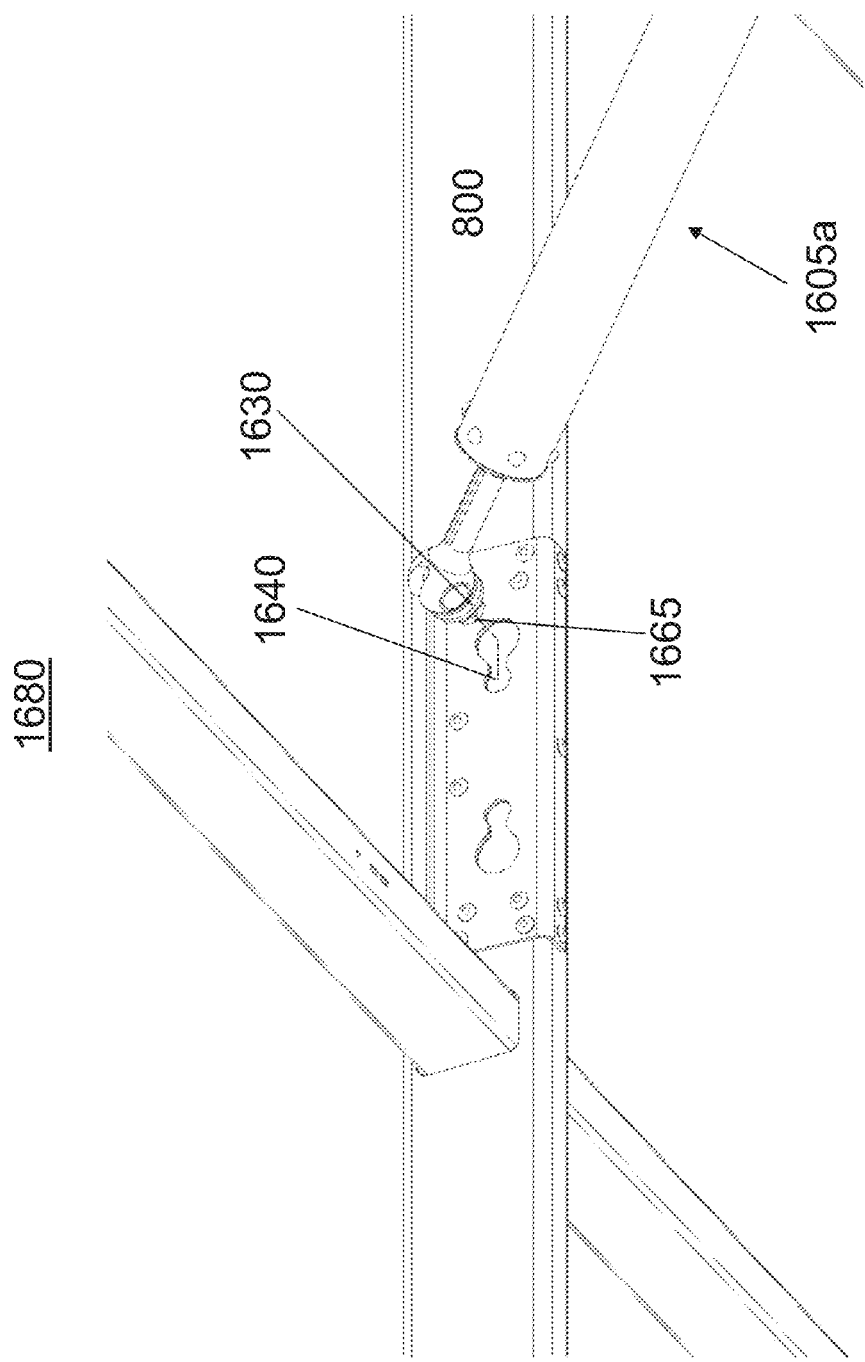
FIG. 16E is a perspective view of a strut-frame connection.

FIG. 16E is a perspective view of a strut-frame connection 1680, according to an illustrative implementation. For example, the strut-frame connection 1680 can be used to secure a strut, such as strut 1605 of FIG. 16B, to a frame, such as module frame 800 of FIG. 8A. the strut-frame connection 1680 contains features identical to those described in connection with the strut-pile connection 1600 of FIG. 16A, and operates in substantially the same manner. As shown in FIG. 16E, the frame 800 includes keyhole cutouts 1640. The strut 1605 is assembled as described above in connection with FIG. 16B, and is then inserted through the keyhole cutout 1640 such that the spherical washer 1630 is seated within the bottom portion of the keyhole cutout 1640. The bolt 1665 is then tightened to secure the strut 1605 to the frame 800.

Figure 17A:
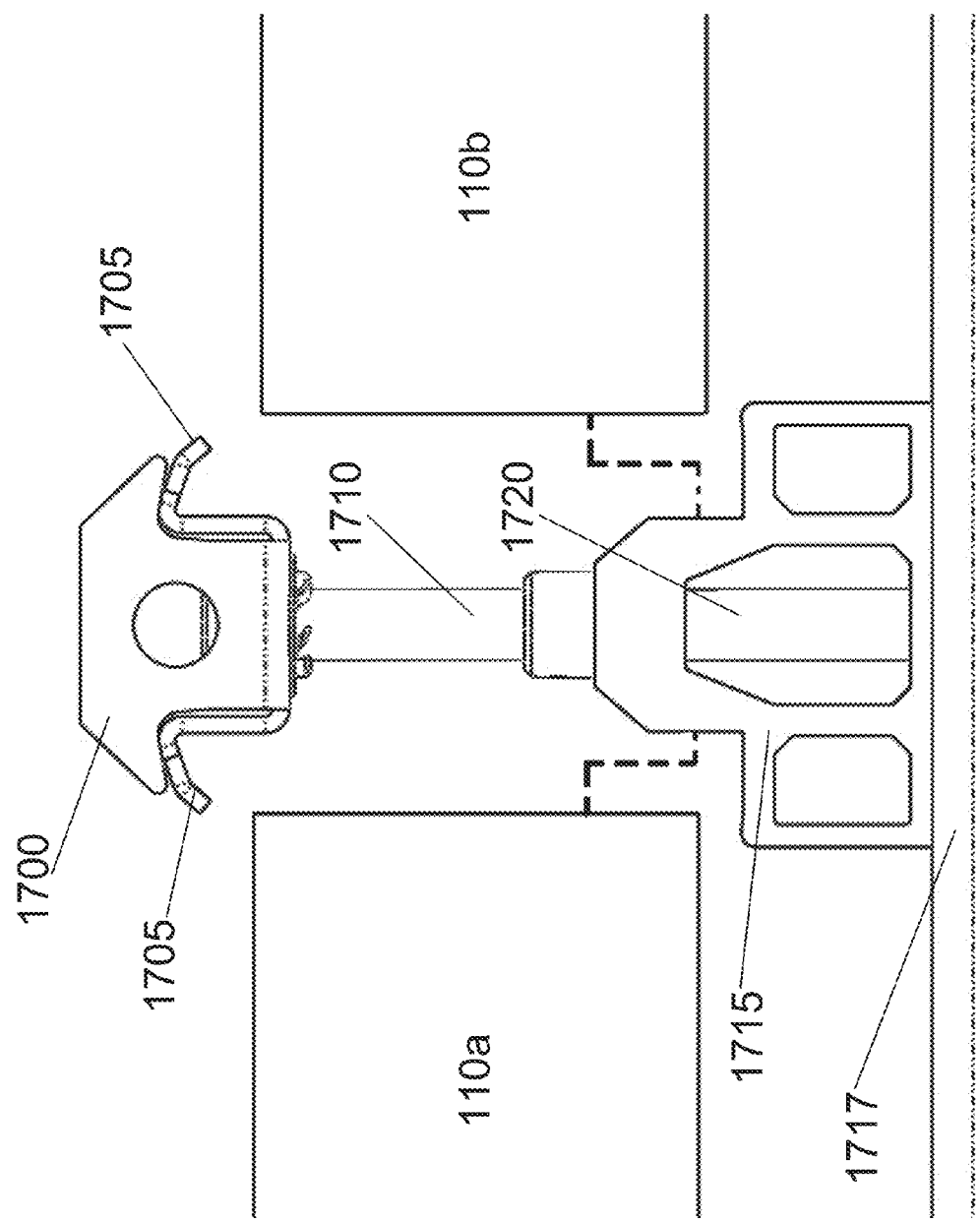
FIG. 17A is a side view of a midclaw for securing two solar panel modules in an uninstalled configuration.

FIG. 17A is a side view of a midclaw 1700 for securing two solar panel modules in an uninstalled configuration, according to an illustrative implementation. For example, the midclaw 1700 can be used to secure two modules, such as modules 110 of FIG. 1A, to a frame such as frame 800 of FIG. 8A.

The midclaw 1700 includes two flanges 1705, a midclaw bolt 1710, a rafter block 1715, and a rafter block bolt 1720. The rafter block 1715 is mounted on top of rafter 1717 (e.g., a portion of a frame such as frame 800 of FIG. 8A). When the rafter block 1715 is secured to the rafter 1717 with the rafter block bolt 1720, the midclaw 1700 remains in a fixed position, allowing a technician to correctly place the modules 110*a* and 110*b* against the top side of the rafter block 1715, without being concerned about the position of the claw 1700. The midclaw bolt 1710 can then be tightened, lowering the midclaw 1700 until the modules 110*a* and 110*b* are secured between the top of the rafter block 1715 and the flanges 1705.

FIG. 17B is a side view of the midclaw of FIG. 17A in its fully installed configuration, according to an illustrative implementation. The bottom surface of rafter block 1715 is secured flush against the rafter 1717 by the rafter block bolt 1720. The bottom surfaces of modules 110*a* and 110*b* lie flat against the top surface of the rafter block 1715, and the midclaw bolt 1710 has been tightened so that the flanges 1705 secure the top surfaces of the modules 110*a* and 110*b*.

Figure 17C:
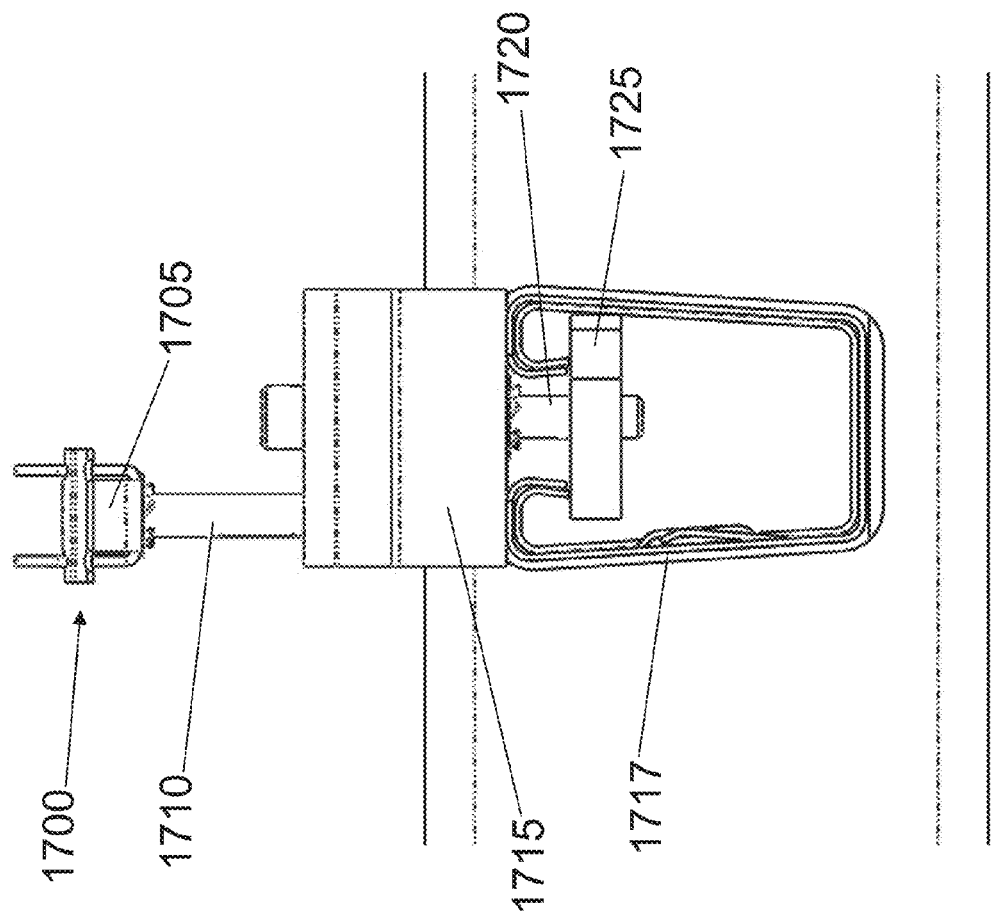
FIG. 17C is an end view of the midclaw of FIG. 17A in its fully installed configuration.

FIG. 17C is an end view of the midclaw of FIG. 17A in its fully installed configuration, according to an illustrative implementation. The rafter block 1715 is mounted on top of the rafter 1717. Note that the rafter 1717 has a hollow U-shaped structure, and a rafter nut 1725 is secured to the bottom of the rafter bolt 1720 and located within the rafter 1717. Thus, to secure the rafter block 1715 to the rafter 1717, a technician can tighten the rafter bolt 1725 until it is positioned against the inside surface of the rafter 1717 while the rafter block 1715 is positioned against the outside surface of the rafter 1717. As described above, the technician can then focus on aligning the solar panel modules rather than worrying about the position of the midclaw 1700. For clarity, the solar panel modules are not visible in FIG. 17C. The modules can be placed on top of the rafter block 1715, and a technician can then tighten the midclaw bolt 1710 until the flanges 1705 contact the modules, securing the modules between the flanges 1705 and the rafter block 1715.

Figure 18A:
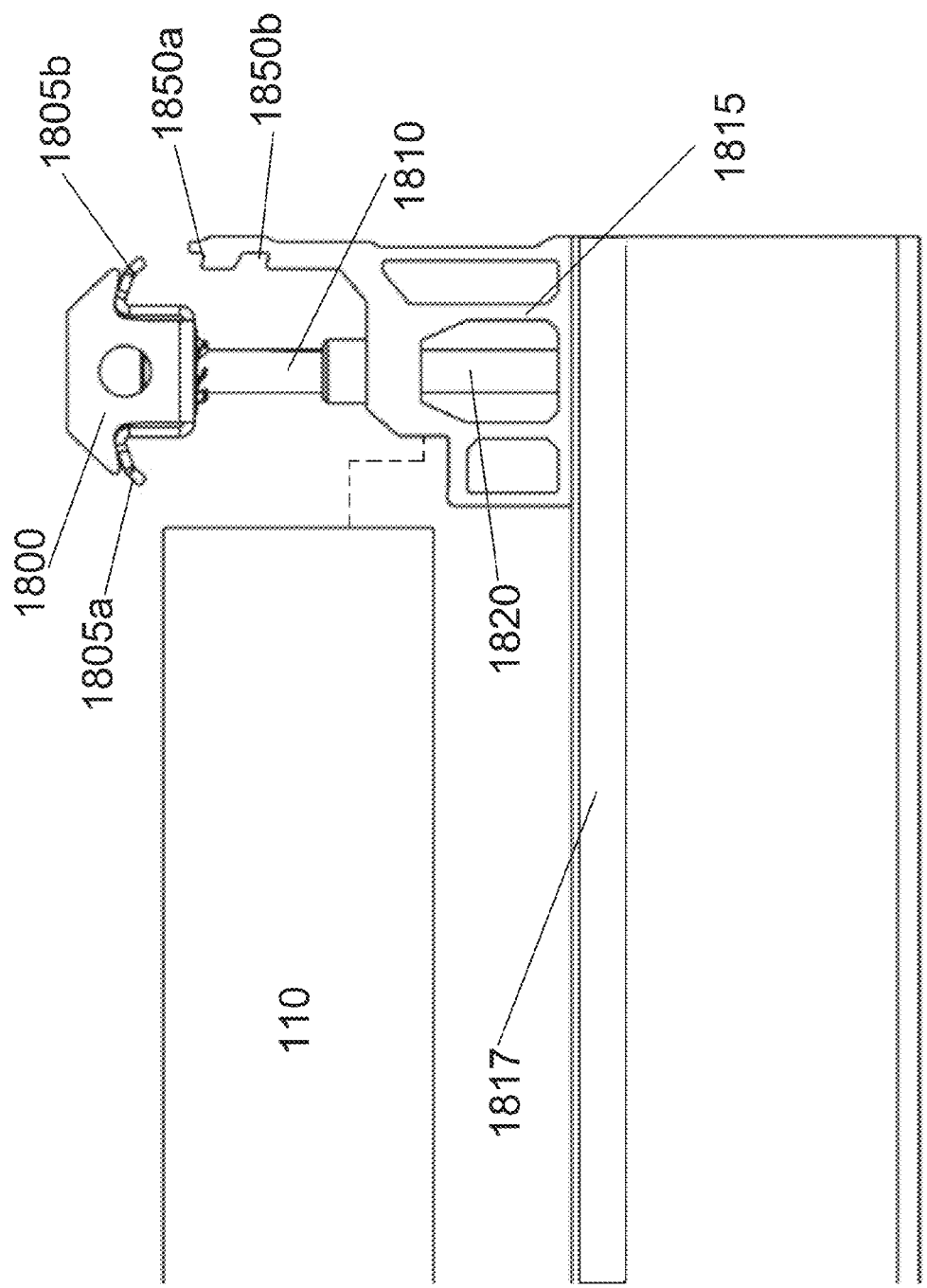
FIG. 18A is a side view of an endclaw for securing a solar panel module at the end of a module array in an uninstalled configuration.

FIG. 18A is a side view of an endclaw 1800 for securing a solar panel module at the edge of a module array in an uninstalled configuration, according to an illustrative implementation. For example, the endclaw 1800 can be used to secure a module, such a module 110 of FIG. 1A which does not share an edge with another module in the array, to a frame, such as frame 800 of FIG. 8A. The endclaw 1800 includes many features similar to those of the midclaw 1700 of FIG. 17A. For example, the endclaw 1800 includes two flanges 1805*a* and 1805*b*, an endclaw bolt 1810, a rafter block 1815, and a rafter block bolt 1820. Unlike the rafter block 1715 of FIG. 17A, the rafter block 1815 is asymmetrical in side view, and includes a raised portion on one side. The raised portion includes two grooves 1850*a* and 1850*b*.

The rafter block 1815 is mounted on top of rafter 1817 (e.g., a portion of a frame such as frame 800 of FIG. 8A). When the rafter block 1815 is secured to the rafter 1817 with the rafter block bolt 1820, the endclaw 1800 remains in a fixed position, allowing a technician to correctly place the module 110 against the top side of the rafter block 1815, without being concerned about the position of the claw 1800. The endclaw bolt 1810 can then be tightened, lowering the endclaw 1800 until the module 110 is secured between the top of the rafter block 1815 and the flange 1805*a*. The flange 1805*b* is then secured against the raised portion of the rafter block 1815 in groove 1850*a*. This allows the endclaw 1800 to remain level prevents the endclaw 1800 and the endclaw bolt 1810 from experiencing torsional forces. Instead, the endclaw 1800 and the endclaw bolt 1810 are subjected only to tension forces, which helps to preserve the structural integrity of the endclaw 1800 and hold the module 110 more securely. In this example, the flange 1805*b* rests against groove 1850*a* because groove 1850*a* is at substantially the same height as the module 110. In other implementations, the flange 1805*b* could be secured against the second groove 1850*b* to accommodate a module of a different height.

Figure 18B:
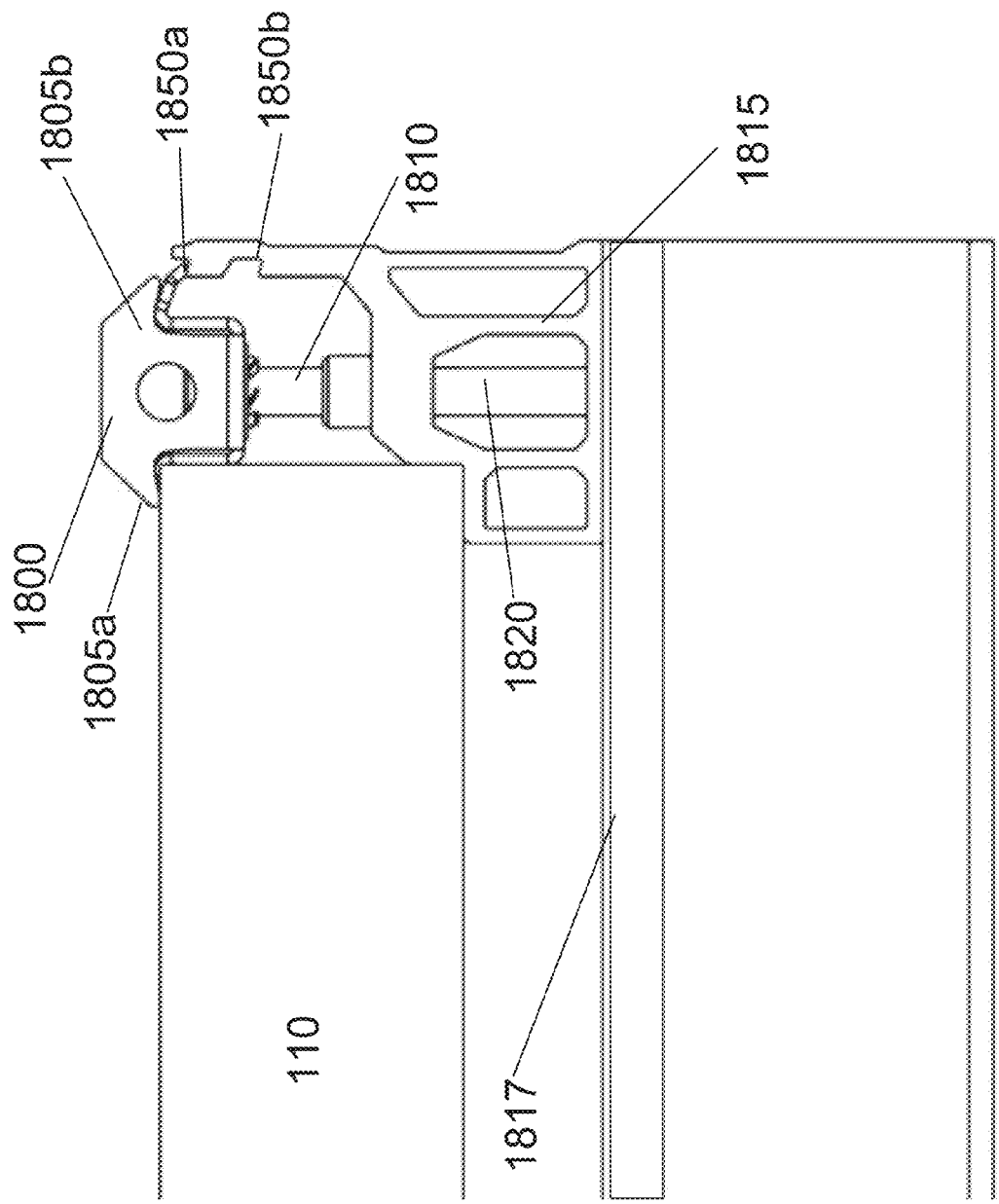
FIG. 18B is a side view of the endclaw of FIG. 18A in its fully installed configuration.

FIG. 18B is a side view of the endclaw of FIG. 18A in its fully installed configuration, according to an illustrative implementation. The bottom surface of rafter block 1815 is secured flush against the rafter 1817 by the rafter block bolt 1820. The bottom surfaces of module 110 lies flat against the top surface of the rafter block 1815, and the endclaw bolt 1810 has been tightened so that the flange 1805*a* secures the top surface of the modules 110 and the flange 1805*b* is secured in the groove 1850*a*.

Figure 18C:
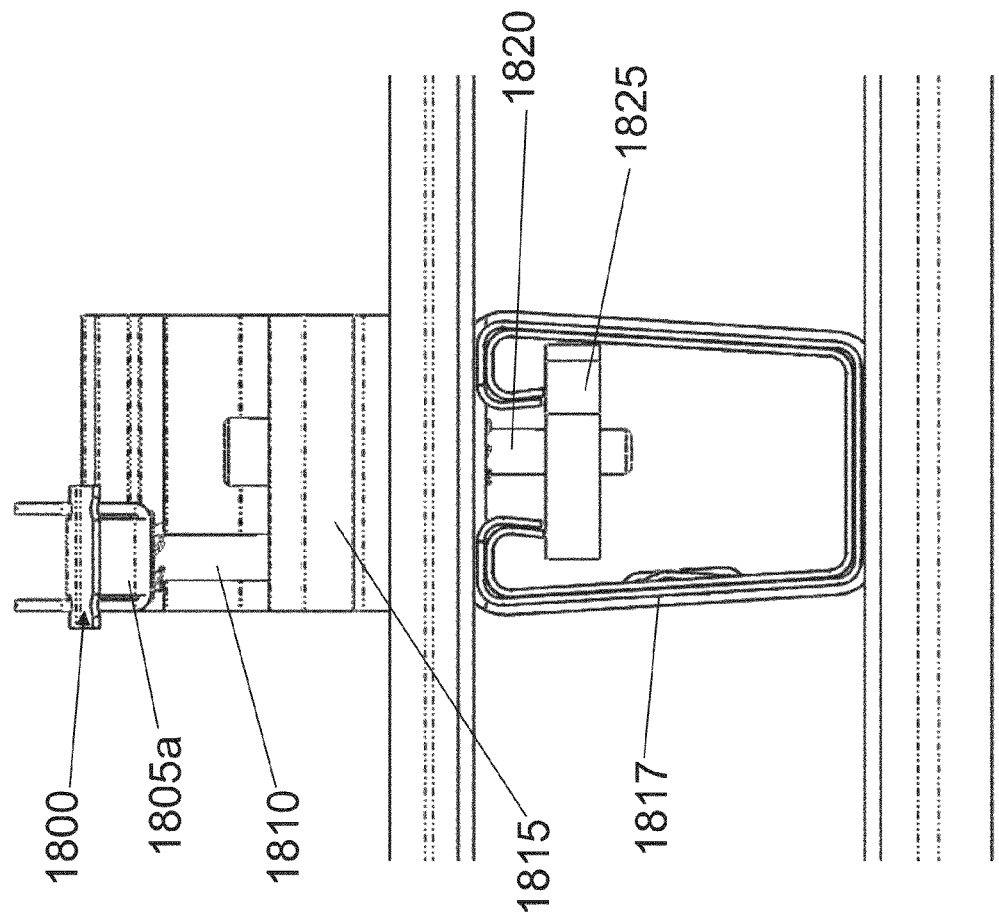
FIG. 18C is an end view of the endclaw of FIG. 18A in its fully installed configuration.

FIG. 18C is an end view of the endclaw of FIG. 18A in its fully installed configuration, according to an illustrative implementation. The rafter block 1815 is mounted on top of the rafter 1817. Note that the rafter 1817 has a hollow U-shaped structure, and a rafter nut 1825 is secured to the bottom of the rafter bolt 1820 and located within the rafter 1817. Thus, to secure the rafter block 1815 to the rafter 1817, a technician can tighten the rafter bolt 1825 until it is positioned against the inside surface of the rafter 1817 while the rafter block 1815 is positioned against the outside surface of the rafter 1817. As described above, the technician can then focus on aligning the solar panel module rather than worrying about the position of the endclaw 1800. For clarity, the solar panel module is not visible in FIG. 18C. The module can be placed on top of the rafter block 1815, and a technician can then tighten the endclaw bolt 110 until the flange 1805*a* contacts the module, securing the module between the flanges 1805*a* and the rafter block 1815.

In some implementations, any of the structural components described above may be used to provide a continuous electrical connection for grounding purposes. For example, materials for components such as struts, bolts, nuts, clamps, and other components can be selected based on their electrical conductivity. Electrically conductive metals, such as aluminum alloys or zinc alloys may be used. Various implementations may include protective coatings over electrically conductive materials. These coatings may be electrically conductive or may be insulating materials. The implementations discussed above may be used to create structures that are electrically grounded even in instances where electrically insulating coatings are used.

For example, serrations on various components may break through an insulating coating to provide an electrical path to ground. In one implementation, a frame such as frame 800 of FIG. 8A may be made from an electrically conductive material coated with an insulating material. The modules may be secured to the frame using the midclaw of FIG. 17A or the end claw of FIG. 18A, which may themselves be made from conductive materials. Serrations on the flanges of the midclaw and endclaw may break through a coating on the frame to provide an electrical connection. The electrical path can continue through other components such as struts and piles so that the solar panel modules are electrically connected to ground for safety or reliability purposes.

Various examples have been given for devices, systems and methods for mounting solar panel modules. As used herein, the term solar panel module refers to a complete, environmentally protected unit designed to generate power when exposed to sunlight and comprising one or more solar cells and, optionally, optics and/or other components (typically exclusive of a tracker). A solar cell is a photovoltaic device that generates electricity when exposed to light. However, some embodiments may be used for mounting solar panel modules or arrays of solar modules, where the term solar panel modules refers to collection of modules mechanically fasten together, wired, and designed to provide a field-installable unit. Various embodiments may be used to mount any other suitable devices (e.g. mirrors, heat tubes, thermoelectric devices, optical devices, etc.).

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

A computer employed to implement at least a portion of the functionality described herein may comprise a memory, one or more processing units (also referred to herein simply as "processors"), one or more communication interfaces, one or more display units, and one or more user input devices. The memory may comprise any computer-readable media, and may store computer instructions (also referred to herein as "processor-executable instructions") for implementing the various functionalities described herein. The processing unit(s) may be used to execute the instructions. The communication interface(s) may be coupled to a wired or wireless network, bus, or other communication means and may therefore allow the computer to transmit communications to and/or receive communications from other devices. The display unit(s) may be provided, for example, to allow a user to view various information in connection with execution of the instructions. The user input device(s) may be provided, for example, to allow the user to make manual adjustments, make selections, enter data or various other information, and/or interact in any of a variety of manners with the processor during execution of the instructions.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03

What is claimed is:

1. An apparatus for mounting a plurality of solar panel modules above a supporting surface, the apparatus comprising:
   a plurality of foundational members embedded in a supporting surface and arranged in a triangular configuration having a first rear foundational member, a second rear foundational member, and a front foundational member;
   a support frame configured to receive the plurality of solar panel modules;
   a support strut assembly configured to attach the support frame to the plurality of foundational members to support the plurality of solar panel modules, the support strut assembly comprising a plurality of strut members, each strut member of the plurality of strut members having an adjustable length; and
   a first kinematic mount fixed to a first one of the plurality of foundational members and configured to receive the plurality of strut members, the first kinetic mount comprising an adjustment mechanism configured to adjust a joining angle of at least one of the received strut members, wherein the support strut assembly comprises:
      a front support structure comprising two struts joined at their base on the front foundational member;
      a first side support structure comprising the first rear foundational member, the first kinematic mount, and two struts joined at their base on the first kinematic mount; and
      a second side support structure comprising two struts joined at their base on the second rear foundational member.

2. The apparatus of claim 1, wherein the plurality of strut members comprises at least three strut members.

3. The apparatus of claim 1, wherein the support strut assembly is configured such that, when attached, the plurality of strut members receive substantially only tension and compression forces.

4. The apparatus of claim 1, wherein the support strut assembly further comprises a cross brace.

5. The apparatus of claim 4, wherein the first side support structure further comprises the cross brace and the cross brace is joined at its base to the first kinematic mount.

6. The apparatus of claim 1, further comprising a second support strut assembly configured to support a second plurality of solar panel modules above the supporting surface, wherein the first side support structure further comprises a first strut of the second support strut assembly and the first strut of the second support strut assembly is joined at the first strut's base to the first kinematic mount.

* * * * *